United States Patent
Takagi et al.

(10) Patent No.: US 9,142,289 B2
(45) Date of Patent: Sep. 22, 2015

(54) METHOD FOR DRIVING VARIABLE RESISTANCE ELEMENT, AND NONVOLATILE MEMORY DEVICE

(75) Inventors: Takeshi Takagi, Kyoto (JP); Koji Katayama, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 141 days.

(21) Appl. No.: 13/883,075

(22) PCT Filed: Jun. 11, 2012

(86) PCT No.: PCT/JP2012/003791
§ 371 (c)(1),
(2), (4) Date: May 2, 2013

(87) PCT Pub. No.: WO2012/172773
PCT Pub. Date: Dec. 20, 2012

(65) Prior Publication Data
US 2013/0223131 A1    Aug. 29, 2013

(30) Foreign Application Priority Data

Jun. 13, 2011  (JP) ................................ 2011-130860

(51) Int. Cl.
*G11C 11/21* (2006.01)
*G11C 13/00* (2006.01)

(52) U.S. Cl.
CPC ........ *G11C 13/0007* (2013.01); *G11C 13/0064* (2013.01); *G11C 13/0069* (2013.01);
(Continued)

(58) Field of Classification Search
CPC ........... G11C 13/0069; G11C 13/0097; G11C 2213/32; H01L 45/145

USPC .......................................................... 365/148
See application file for complete search history.

(56) References Cited

U.S. PATENT DOCUMENTS 7,583,525 B2    9/2009  Shiimoto et al.
7,871,866 B2    1/2011  Jeong et al.
(Continued)

FOREIGN PATENT DOCUMENTS

JP        4-72766       3/1992
JP    2004-363604      12/2004
(Continued)

OTHER PUBLICATIONS

International Search Report issued Jul. 17, 2012 in International (PCT) Application No. PCT/JP2012/003791.
(Continued)

*Primary Examiner* — J. H. Hur
*Assistant Examiner* — Xiaochun L Chen
(74) *Attorney, Agent, or Firm* — Wenderoth, Lind & Ponack, L.L.P.

(57) ABSTRACT

A driving method for driving a variable resistance element and a nonvolatile memory device, which achieves stable storage operation. In a low resistance write process, a low resistance writing voltage pulse having the negative polarity is applied once to a variable resistance layer included in a variable resistance element while in a high resistance write process, a high resistance writing voltage pulse having the positive polarity is applied more than twice to the same variable resistance layer. Here, when a voltage value of one of the high resistance writing voltage pulses is VH1 and a voltage value of the other high resistance writing voltage pulse applied subsequently is VH2, VH1>VH2 is satisfied.

10 Claims, 15 Drawing Sheets

(52) U.S. Cl.
CPC .. *G11C2013/009* (2013.01); *G11C 2013/0073* (2013.01); *G11C 2013/0092* (2013.01); *G11C 2213/15* (2013.01); *G11C 2213/32* (2013.01)

(56) References Cited

U.S. PATENT DOCUMENTS

| | | | |
|---|---|---|---|
| 8,101,983 | B2 | 1/2012 | Seo et al. |
| 8,164,130 | B2 | 4/2012 | Seo et al. |
| 8,199,557 | B2 | 6/2012 | Maejima et al. |
| 8,258,843 | B2 | 9/2012 | Choi et al. |
| 8,446,756 | B2 | 5/2013 | Shiimoto et al. |
| 8,451,648 | B2 | 5/2013 | Kamoshida et al. |
| 2004/0245557 | A1 | 12/2004 | Seo et al. |
| 2007/0114587 | A1 | 5/2007 | Seo et al. |
| 2007/0247894 | A1 | 10/2007 | Shiimoto et al. |
| 2009/0020745 | A1 | 1/2009 | Jeong et al. |
| 2010/0232207 | A1 | 9/2010 | Maejima et al. |
| 2011/0002158 | A1* | 1/2011 | Muraoka et al. ............ 365/148 |
| 2011/0026298 | A1 | 2/2011 | Shiimoto et al. |
| 2011/0051500 | A1* | 3/2011 | Takagi et al. .............. 365/148 |
| 2011/0095797 | A1 | 4/2011 | Choi et al. |
| 2011/0176351 | A1 | 7/2011 | Fujitsuka et al. |
| 2011/0310652 | A1 | 12/2011 | Kim et al. |
| 2012/0014164 | A1 | 1/2012 | Kamoshida et al. |
| 2012/0044749 | A1* | 2/2012 | Muraoka et al. ............ 365/148 |
| 2012/0230082 | A1 | 9/2012 | Maejima et al. |

FOREIGN PATENT DOCUMENTS

| | | |
|---|---|---|
| JP | 2007-294592 | 11/2007 |
| JP | 2009-33160 | 2/2009 |
| JP | 2009-48679 | 3/2009 |
| JP | 2010-211895 | 9/2010 |
| JP | 2011-90756 | 5/2011 |
| JP | 2011-146111 | 7/2011 |
| JP | 2012-9124 | 1/2012 |
| JP | 2012-22742 | 2/2012 |
| WO | 2008/153124 | 12/2008 |
| WO | 2011/052239 | 5/2011 |

OTHER PUBLICATIONS

W. W. Zhuang et al., "Novell Colossal Magnetoresistive Thin Film Nonvolatile Resistance Random Access Memory (RRAM)", 2002 IEEE International Electron Devices Meeting (IEDM), Dec. 8-11, 2002, p. 193-196.

* cited by examiner

METHOD FOR DRIVING VARIABLE RESISTANCE ELEMENT, AND NONVOLATILE MEMORY DEVICE

TECHNICAL FIELD

The present invention relates to a method for driving a variable resistance element, and a nonvolatile memory device implementing the method.

BACKGROUND OF INVENTION

Background Art

In recent years, with advance in digital technology, electronic devices such as mobile information devices and information home appliances have been developed to provide higher functionality. Among them, the use of large capacity nonvolatile memory device, represented by flash memory, is rapidly expanding. Furthermore, as a next-generation new nonvolatile memory replacing the flash memory, there is on-going research and development of a nonvolatile memory device which includes nonvolatile memory elements which have a characteristic in which a resistance value reversibly changes depending on electric signals (for example, see PTL 1 and NPL 1).

The variable resistance element disclosed in PTL 1 includes a data storage material layer (a variable resistance material layer) the resistance of which changes depending on the magnitude and the direction of a voltage or a current pulse. A resistance state of the variable resistance material layer reversibly changes between a high resistance state and a low resistance state, according to the magnitude of the voltage or current pulse applied to the variable resistance material layer.

CITATION LIST

Patent Literature

[PTL 1] Japanese Unexamined Patent Application Publication No. 2004-363604

Non Patent Literature

[NPL 1] W Zhuang et al., "Novell Colossal Magnetoresistive Thin Film Nonvolatile Resistance Random Access Memory (RRAM)," IEDM Technical Digest, pp. 193-196, December 2002

SUMMARY OF INVENTION

In a conventional nonvolatile memory device as described above, there arises a problem that it is difficult to achieve both stable storage operation and reduction of variations in the resistance value.

The present invention is made in view of the above problem and provides a method for driving a variable resistance element which can reduce the variations in the resistance value and achieve stable storage operation, and a nonvolatile memory device.

To solve the above described problem, a drive method for driving a variable resistance element according to an aspect of the present invention is a driving method for driving a variable resistance element including a first electrode, a second electrode, and a variable resistance layer interposed between the first electrode and the second electrode and a resistance value of which reversibly changes based on a voltage pulse applied between the first electrode and the second electrode, the driving method including: a low resistance write process in which a resistance state of the variable resistance layer is changed from a high resistance state to a low resistance state by applying a low resistance writing voltage puke having a first polarity to the variable resistance layer; and a high resistance write process in which the resistance state of the variable resistance layer is changed from the low resistance state to the high resistance state by applying a high resistance writing voltage pulse having a second polarity different from the first polarity to the variable resistance layer, wherein the high resistance write process completes one change of the resistance state of the variable resistance layer to the high resistance state by applying at least a plurality of the high resistance writing voltage pulses to the variable resistance layer, the high resistance write process includes the steps of (a) applying a first high resistance writing voltage pulse having a voltage value VH1 between the first electrode and the second electrode; and (b) applying a second high resistance writing voltage pulse having a voltage value VH2 smaller than the voltage value VH1 to the variable resistance layer, the second high resistance writing voltage pulse being applied to the variable resistance layer subsequently to the first high resistance writing voltage pulse.

According to the method for driving the variable resistance element and the nonvolatile memory device according to the present invention, the variations in the resistance value can be reduced and stable storage operation can be achieved.

DETAILED DESCRIPTION OF INVENTION

Figure 1:
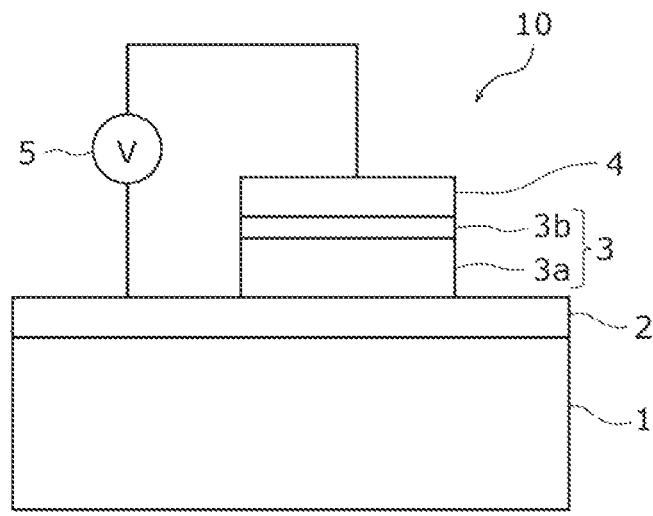
FIG. 1 is a schematic view showing an example configuration of a variable resistance element according to an embodiment 1 of the present invention.

Hereinafter, before describing the details of embodiments of the present invention, underlying knowledge forming basis of the present invention will be described.

To ensure stable storage operation of a nonvolatile memory device, it is necessary that there is a sufficiently large difference between a high resistance state in which the resistance value is high and a low resistance state in which the resistance value is low in a variable resistance layer. Thus, for example, such measures as increasing the difference in resistance value between the high resistance state and the low resistance state by increasing the resistance value in the variable resistance layer by increasing the voltage of a voltage pulse for changing the resistance state to the high resistance state, the high resistance state are possible.

Here, application of the voltage pulse having a high voltage to the variable resistance layer, oxidization reaction actively occurs in the variable resistance layer, and thereby the resistance state of the variable resistance layer proceeds to the high resistance state. On the other hand, application of the voltage pulse having a high voltage to the variable resistance layer, the dielectric breakdown more likely to occur, and thereby the resistance state of the variable resistance layer is facilitated to proceed to the low resistance state. Thus, for the variable resistance layer to which a voltage pulse of a high voltage is applied, a conflict between the resistance change to the high resistance state which is due to oxidization reaction and the resistance change to the low resistance state caused by the dielectric breakdown occurs in the variable resistance layer, ends up varying the resistance value. Thus there arises a problem that stable storage operation is difficult to achieve.

In view of the above problems, through intensive studies by the inventors, the inventors have found a drive method for driving a variable resistance element which can reduce the variations in the resistance value and achieve stable storage operation and a nonvolatile memory device implementing the method.

A drive method for driving a variable resistance element according to an aspect of the present invention is a driving method for driving a variable resistance element including a first electrode, a second electrode, and a variable resistance layer interposed between the first electrode and the second electrode and a resistance value of which reversibly changes based on a voltage pulse applied between the first electrode and the second electrode, the driving method including: a low resistance write process in which a resistance state of the variable resistance layer is changed from a high resistance state to a low resistance state by applying a low resistance writing voltage pulse having a first polarity to the variable resistance layer; and a high resistance write process in which the resistance state of the variable resistance layer is changed from the low resistance state to the high resistance state by applying a high resistance writing voltage pulse having a second polarity different from the first polarity to the variable resistance layer, wherein the high resistance write process completes one change of the resistance state of the variable resistance layer to the high resistance state by applying at least a plurality of the high resistance writing voltage pulses to the variable resistance layer, the high resistance write process includes the steps of: (a) applying a first high resistance writing voltage pulse having a voltage value VH1 between the first electrode and the second electrode; and (b) applying a second high resistance writing voltage pulse having a voltage value VH2 smaller than the voltage value VH1 to the variable resistance layer, the second high resistance writing voltage pulse being applied to the variable resistance layer subsequently to the first high resistance writing voltage pulse.

According to the above configuration, since the first high resistance writing voltage pulse of the voltage value VH1 is applied to the variable resistance layer to change the resistance state of the variable resistance layer to the high resistance state and then the second high resistance writing voltage pulse of the voltage value VH2 smaller than VH1 is applied to the variable resistance layer, the resistance value of the variable resistance layer the resistance state of which has been chanced to the high resistance state by the first high resistance writing voltage pulse can be more stabilized by the second high resistance writing voltage pulse. This can stabilize the storage operation of the variable resistance element. Moreover, since the voltage value VH2 of the second high resistance writing voltage pulse is smaller than the voltage value VH1 of the first high resistance writing voltage pulse, the variations in the resistance value can be reduced.

Moreover, preferably, in the high resistance write process, step (b) is executed subsequently to step (a).

According to the above configuration, subsequently to the first high resistance writing voltage pulse for changing the resistance state of the variable resistance layer to the high resistance state, the second high resistance writing voltage pulse for stabilizing the resistance value of the variable resistance layer is applied to the variable resistance layer, thereby more stabilizing the resistance value of the variable resistance layer.

Moreover, preferably, the variable resistance layer has a stacked structure including: a first metal oxide layer comprising an oxide of a first metal; and a second metal oxide layer comprising an oxide of a second metal and having a lower oxygen deficiency than the first metal oxide layer.

Moreover, the second electrode is in contact with the second metal oxide layer, and the second polarity is a polarity where a voltage of the second electrode is positive relative to a potential of the first electrode.

According to the above configuration, in the variable resistance layer which performs the bipolar operation, the resistance value of the variable resistance layer the resistance state of which has changed to the high resistance state can be stabilized.

Moreover, the first metal is a first transition metal, and the second metal is a second transition metal.

Moreover, a drive method for driving variable resistance element according to an aspect of the present invention is a driving method for driving a variable resistance element including a first electrode, a second electrode, and a variable resistance layer interposed between the first electrode and the second electrode and a resistance value of which reversibly changes based on a voltage pulse applied between the first electrode and the second electrode, the driving method including: a low resistance write process in which a resistance state of the variable resistance layer is changed from a high resistance state to a low resistance state by applying a low resistance writing voltage pulse having a first polarity to the variable resistance layer; and a high resistance write process in which the resistance state of the variable resistance layer is changed from the low resistance state to the high resistance state by applying a high resistance writing voltage pulse having a second polarity different from the first polarity to the variable resistance layer, wherein the high resistance write process completes one change of the resistance state of the variable resistance layer to the high resistance state by applying at least a plurality of the high resistance writing voltage pulses to the variable resistance layer, the high resistance write process includes the steps of; (a) applying a first high resistance writing voltage pulse having a voltage value VH1 between the first electrode and the second electrode; (b) verifying whether the resistance state of the variable resistance layer has changed to the high resistance state; and (c) applying a second high resistance writing voltage pulse having a voltage value VH2 smaller than the voltage value VH1 to the variable resistance layer, the second high resistance writing voltage pulse being applied to the variable resistance layer subsequently to the first high resistance writing voltage pulse, wherein when it is verified in step (b) that the resistance state of the variable resistance layer has changed to the high resistance state, the second high resistance writing voltage pulse is applied to the variable resistance layer in step (c), and when it is verified in step (b) that the resistance state of the variable resistance layer has not changed to the high resistance state, the first high resistance writing voltage pulse is applied again to the variable resistance layer.

According to the above configuration, the first high resistance writing voltage pulse of the voltage value VH1 is applied to the variable resistance layer to change the resistance state of the variable resistance layer to the high resistance state and then the second high resistance writing voltage pulse of the voltage value VH2 smaller than VH1 is applied to the variable resistance layer, the resistance value of the variable resistance layer the resistance state of which has been changed to the high resistance state by the first high resistance writing voltage pulse can be more stabilized by the second high resistance writing voltage pulse. This can stabilize the storage operation of the variable resistance element. Moreover, since the voltage value VH2 of the second high resistance writing voltage pulse is smaller than the voltage value VH1 of the first high resistance writing voltage pulse, the variations in the resistance value can be reduced. Furthermore, the step of verifying whether the resistance state of the variable resistance layer has been changed to the high resistance state is included after the application of the first high resistance writing voltage pulse, a voltage value of the voltage pulse to be applied subsequently can be selected depending on whether the resistance state of the variable resistance layer has changed to the high resistance state. This can stabilize the storage operation of the variable resistance element.

Moreover, preferably, when it is verified in step (b) that the resistance state of the variable resistance layer has not changed to the high resistance state, the first high resistance writing voltage pulse is applied again to the variable resistance element by executing step (a) prior to step (c).

Moreover, preferably, when it is verified in step (b) that the resistance state of the variable resistance layer has not changed to the high resistance state, the first high resistance writing voltage pulse and, subsequently, the second high resistance writing voltage pulse are applied to the variable resistance layer in step (b).

According to the above configuration, the stabilization and the resistance change to the high resistance state of the variable resistance layer can be efficiently performed.

An nonvolatile memory device according to an embodiment of the present invention is a nonvolatile memory device including a variable resistance element and a voltage pulse application device, the variable resistance element being nonvolatile and including: a first electrode; a second electrode; and a variable resistance layer interposed between the first electrode and the second electrode and a resistance value of which reversibly changes based on a voltage pulse applied between the first electrode and the second electrode, the voltage pulse application device being configured to perform: a low resistance write process in which a resistance state of the variable resistance layer is changed from a high resistance state to a low resistance state by applying a low resistance writing voltage pulse having a first polarity to the variable resistance layer; and a high resistance write process in which the resistance state of the variable resistance layer is changed from the low resistance state to the high resistance state by applying a high resistance voltage pulse having a second polarity different from the first polarity to the variable resistance layer, wherein the high resistance write process completes one change of the resistance state of the variable resistance layer to the high resistance state by applying at least a plurality of the high resistance writing voltage pulses to the variable resistance layer, and in the high resistance write process, processing of applying at least a first high resistance writing voltage pulse having a voltage value VH1 between the first electrode and the second electrode and, subsequently, processing of applying a second high resistance writing voltage pulse having a voltage value VH2 smaller than the voltage value VH1 are performed.

According to the above configuration, since the first high resistance writing voltage pulse of the voltage value VH1 is applied to the variable resistance layer to change the resistance state of the variable resistance layer to the high resistance state and then the second high resistance writing voltage pulse of the voltage value VH2 smaller than VH1 is applied to the variable resistance layer, the resistance value of the variable resistance layer the resistance state of which has been changed to the high resistance state by the first high resistance writing voltage pulse can be more stabilized by the second high resistance writing voltage pulse. This can stabilize the storage operation of the variable resistance element.

Moreover, preferably, the voltage pulse application device applies the first high resistance writing voltage pulse and, subsequently, the second high resistance writing voltage pulse between the first electrode and the second electrode.

According to he above configuration, the stabilization and the resistance change to the high resistance state of the variable resistance layer can be efficiently performed.

Moreover, preferably, the variable resistance layer has a stacked structure including: a first metal oxide layer comprising an oxide of a first metal; and a second metal oxide layer comprising an oxide of a second metal and having a lower oxygen deficiency khan the first metal oxide layer.

Moreover, preferably, a resistance value of the second metal oxide layer is greater than a resistance value of the first metal oxide layer.

Moreover, preferably, the first metal and the second metal are the same metal.

Moreover, preferably, the first metal is a first transition metal and the second metal is a second transition metal.

Moreover, preferably, the variable resistance layer includes an oxygen-deficient first tantalum oxide layer having a composition represented by $TaO_x$ (wherein $0.8 \leq x \leq 1.9$) and a second tantalum oxide layer having a composition represented by $TaO_y$ (wherein $2.1 \leq y$).

According to the above configuration, the resistance value of the variable resistance layer is stably and rapidly changeable.

Moreover, preferably, the first metal and the second metal are different metals and a standard electrode potential of the second metal is lower than a standard electrode potential of the first metal.

Hereinafter, embodiments of the present invention will be described in detail with accompanying drawings. It should be noted that the embodiments described below are each merely a preferred illustration of the present invention. Values, shapes, materials, components, disposition or a form of connection between the components, steps, and the order of the steps are merely illustrative, and are not intended to limit the present invention. Thus, among components of the below embodiments, components not set forth in the independent claims indicating the top level concept of the present invention will be described as components for preferable embodiments. It should be noted that figures are schematic views and do not necessarily illustrate the present disclosure precisely.

Embodiment 1

Configuration of Variable Resistance Element

First, the configuration of a variable resistance element according to the embodiment 1 of the present invention will be described.

FIG. 1 is a schematic view showing an example configuration of the variable resistance element according to the embodiment 1 of the present invention. As shown in FIG. 1, a variable resistance element 10 according to the present embodiment includes a substrate 1, a first electrode (bottom electrode) 2 formed above the substrate 1, a variable resistance layer 3 formed above the first electrode 2, and a second electrode (top electrode) 4 formed above the variable resistance layer 3. Specifically, the variable resistance layer is disposed so as to be interposed between the first electrode 2 and the second electrode 4. The first electrode 2 and the second electrode 4 are electrically connected to the variable resistance layer 3.

The substrate 1 is, for example, a silicon substrate. The first electrode 2 and the second electrode 4 are, for example, made of one or more of Au (gold), Pt (platinum), Ir (iridium), and Cu (copper).

The variable resistance layer 3 has a stacked structure including a first transition metal oxide layer 3a and a second transition metal oxide layer 3b. In the present embodiment, as an example, a first tantalum oxide layer 3a and a second tantalum oxide layer 3b are stacked, forming the variable resistance layer 3. Here, the oxygen content percentage of the second tantalum oxide layer 3b is higher than the oxygen content percentage of the first tantalum oxide layer 3a. In other words, the oxygen deficiency in the second tantalum oxide layer 3b is lower than the oxygen deficiency in the first tantalum oxide layer 3a.

It should be noted that the oxygen deficiency refer to a percentage of deficient in oxygen to the amount of oxygen constituting an oxide having a stoichiometric composition in each transition metal oxide. For example, if the transition metal is tantalum (Ta), a stoichiometric composition of the oxide is $Ta_2O_5$, thus represented by $TaO_{2.5}$. The oxygen deficiency in $TaO_{2.5}$ is 0%. For example, the oxygen deficiency in an oxygen-deficient tantalum oxide having a composition of $TaO_{1.5}$ satisfies the oxygen deficiency=$(2.5-1.5)/2.5=40\%$. The oxygen content percentage of $Ta_2O_5$ is a percentage (O/(Ta+O)) of the number of oxygen atoms relative to the total number of atoms, which is 71.4%. Thus, the oxygen content percentage of the oxygen-deficient tantalum oxide is greater than 0% and smaller than 71.4%.

In the present embodiment, for example, when the composition of the first tantalum oxide layer 3a is represented by $TaO_x$, $0.8 \leq x \leq 1.9$ is satisfied and when the composition of the second tantalum oxide layer 3b is represented by $TaO_y$, $2.1 \leq y$ is satisfied. This configuration can stably and rapidly change the resistance value of the variable resistance layer 3. Thus, preferably, x and y are within the above ranges.

While change in the resistance value of the variable resistance layer 3 is observed when the thickness of the variable resistance layer 3 is 1 μm or less, the thickness is preferably 200 nm or less. This is because when lithography as patterning is employed, it is easy to process the variable resistance layer 3 and the value of the voltage pulse required to change the resistance value of the variable resistance layer 3 can be reduced. On the other hand, in view of assuredly avoiding the breakdown (dielectric breakdown) when the voltage pulse is applied to the variable resistance layer 3, preferably, the thickness of the variable resistance layer 3 is at least 5 nm or greater.

For the thickness of the second tantalum oxide layer 3b, if the thickness is excessively large, there is the disadvantage that the initial resistance value is excessively high, and if the thickness is excessively small, there is the disadvantage that stable resistance change cannot be obtained. Thus, preferably, the thickness is equal to or greater than about 1 nm and equal to or less than about 8 nm.

In the variable resistance element 10 shown in FIG. 1, the first electrode 2 is disposed in contact with the first tantalum oxide layer 3a, and the second electrode 4 is disposed in contact with the second tantalum oxide layer 3b. To operate the variable resistance element 10 configured as described above, the first electrode 2 and the second electrode 4 are electrically connected to different terminals of a power supply 5. The power supply 5 functions as an electric puke application device for driving the variable resistance element 10 and is configured to apply, between the first electrode 2 and the second electrode 4, an electric pulse (voltage pulse) having a predetermined polarity and a predetermined voltage for predetermined duration. For example, when a voltage which changes the variable resistance layer 3 in the high resistance state to the low resistance state is a low resistance writing voltage pulse having a first polarity, and when a voltage which changes the resistance state of the variable resistance layer 3 from the low resistance state to the high resistance state is a high resistance writing voltage pulse having a second polarity, the second polarity is a polarity where the voltage of the second electrode is positive relative to the potential of the first electrode.

[Method of Manufacturing Variable Resistance Element]

Next, a method for manufacturing the variable resistance element 10 will be described.

First, the first electrode 2 having a thickness of 0.2 μm is formed above the substrate 1 by a sputtering method. Then, a tantalum oxide layer is formed above the first electrode 2 by what is called a reactive sputtering method in which a Ta target is sputtered in argon gas and oxygen gas. Here, an oxygen content percentage of the tantalum oxide layer can readily be adjusted by changing a ratio of the oxygen gas flow rate to argon gas. It should be noted that the substrate temperature may be a room temperature without particularly heating the substrate.

Next, oxidizing a top surface of the tantalum oxide layer formed as described above modifies the surface. This forms, in the surface of the tantalum oxide layer, a region (a second region) having a higher oxygen content percentage than a non-oxidized region (a first region) of the tantalum oxide layer. The first region and the second region correspond to the first tantalum oxide layer 3a and the second tantalum oxide layer 3b, respectively, and the first tantalum oxide layer 3a and the second tantalum oxide layer 3b thus formed form the variable resistance layer 3.

Next, the variable resistance element 10 is obtained by forming, by the sputtering method, the second electrode 4 having a thickness of 0.2 μm above the variable resistance layer 3 formed in such a manner described above.

The sizes and shapes of the first electrode 2, the second electrode 4, and the variable resistance layer 3 are adjustable by mask and lithography. In the present embodiment, the sizes of the first electrode 2 and the variable resistance layer 3 are 0.5 μm×0.5 μm (area 0.25 μm²), and the size of a portion where the second electrode 4 and the variable resistance layer 3 are in contact is also 0.5 μm×0.5 μm (area 0.25 μm²).

Moreover, in the present embodiment, the composition of the first tantalum oxide layer 3a is represented by $TaO_x$ (x=1.54) and the composition of the second tantalum oxide layer 3b is represented by $TaO_y$ (y=2.47). Furthermore, the thickness of the variable resistance layer 3 is 30 nm, the thickness of the first tantalum oxide layer 3a is 25 nm, and the thickness of the second tantalum oxide layer 3b is 5 nm.

It should be noted as described above that while x=1.54 and y=2.47 are satisfied in the present embodiment, the values of x and y are not limited thereto. As described above, when the value of x is in the range of 0.8 to 1.9 both inclusive, and the value of y is in the range equal to or greater than 2.1 (2.1≤y), a stable resistance change can be achieved as with the resistance change characteristics in the present embodiment.

[Basic Operation of Variable Resistance Element]

Next, operation of the variable resistance element 10 obtained by the above manufacturing method will be described.

The resistance value of the variable resistance layer 3 decreases by applying, using the power supply 5, a low resistance writing voltage pulse which is a voltage pulse having the negative polarity, between the first electrode 2 and the second electrode 4, and the resistance state of the variable resistance layer 3 changes from the high resistance state to the low resistance state. This, hereinafter, will be referred to as low resistance write process.

On the other hand, the resistance value of the variable resistance layer 3 increases by applying, using the power supply 5, a high resistance writing voltage pulse which is a voltage pulse having the positive polarity, between the first electrode 2 and the second electrode 4, and the resistance state of the variable resistance layer 3 changes from the low resistance state to the high resistance state. This, hereinafter, will be referred to as high resistance write process.

In the high resistance write process, one change of the resistance state of the variable resistance layer to the high resistance state is completed by applying at least a plurality of high resistance writing voltage pulses between the first electrode 2 and the second electrode 4.

As described above, in the variable resistance element according to the present embodiment, the resistance value of the variable resistance layer 3 reversibly changes between the low resistance state and the high resistance state, based on the voltage pulse provided between the first electrode 2 and the second electrode 4. The case where the negative voltage relative to the first electrode 2 is applied to the second electrode 4 defines the voltage as having the negative polarity, and the case where the positive voltage relative to the first electrode 2 is applied to the second electrode 4 defines the voltage as having the positive polarity.

It should be noted that when the variable resistance layer 3 is in the low resistance state, even if the voltage pulse having the negative polarity that is the same polarity as of the low resistance writing voltage pulse is applied between the first electrode 2 and the second electrode 4, the variable resistance layer 3 remains in the low resistance state. Similarly, when the variable resistance layer 3 is in the high resistance state, even if the voltage pulse having the positive polarity that is the same polarity as of the high resistance writing voltage pulse is applied between the first electrode 2 and the second electrode 4, the variable resistance layer 3 remains in the high resistance state.

Next, description will be given where the variable resistance element 10 is used as a memory to write/read 1-bit data. It should be noted that, hereinafter, the resistance value of the variable resistance layer 3 being a low resistance value corresponds to 1-bit data representing "1" and the resistance value of the variable resistance layer 3 being a high resistance value corresponds to 1-bit data representing "0."

Figure 2:
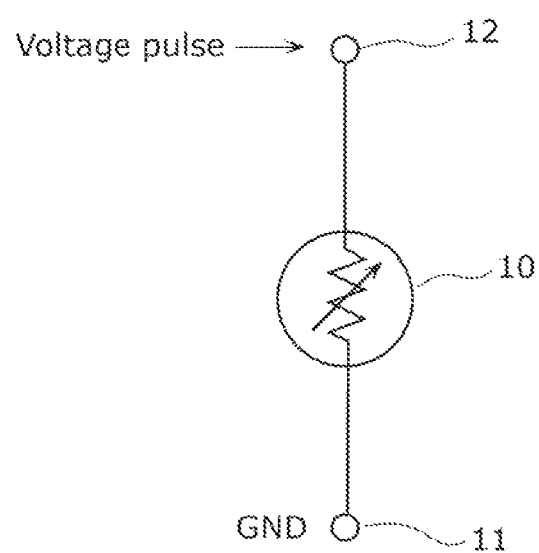
FIG. 2 is a diagram showing an exemplary configuration of a circuit which operates the variable resistance element according to the embodiment 1 of the present invention.

FIG. 2 is a diagram showing an exemplary configuration of a circuit which operates the variable resistance element 10 according to the embodiment 1 of the present invention. As shown in FIG. 2, the circuit includes the variable resistance element 10, a first terminal 11, and a second terminal 12. The first electrode 2 and the second electrode 4 included in the variable resistance element 10 are electrically connected to the first terminal 11 and the second terminal 12, respectively. As shown in FIG. 2, the first terminal 11 is grounded (ground: GND), and a voltage pulse is supplied to the second terminal 12. The voltage pulse is specified relative to the first electrode 2 and the ground.

When the variable resistance element 10 is in the initial state and if a low resistance writing voltage pulse having the negative polarity is supplied to the second terminal 12, the resistance value of the variable resistance layer 3 decreases, bringing the resistance state of the variable resistance layer 3 to the low resistance state (the low resistance write process). In this manner, 1-bit data representing "1" is written. When the variable resistance element 10 is in the low resistance state and if the high resistance writing voltage pulse having the positive polarity is supplied to the second terminal 12, the resistance value of the variable resistance layer 3 increases, bringing the resistance state of the variable resistance layer 3 from the low resistance state to the high resistance state (the high resistance write process). In this manner, 1-bit data representing "0" is written.

Here, the resistance change operation is broadly divided into unipolar operation and bipolar operation, depending on the polarity and the magnitude of the voltage applied to the variable resistance element 10 in data writing process.

The unipolar operation (non-polar operation), typically, refers to operation in which a high resistance writing voltage and a low resistance writing voltage having the same polarity are applied to the variable resistance element 10 to cause resistance charge in the variable resistance element 10. It should be noted that in the unipolar operation (non-polar operation), the same operation is possible in both positive and negative polarities, and whether the resistance state of the variable resistance element 10 changes to the high resistance state or to the low resistance state is independent of the polarity. In that case, however, an absolute value of the low resistance writing voltage is greater than an absolute value of the high resistance writing voltage at an effective voltage applied to the variable resistance element 10 alone.

The bipolar operation, on the other hand, refers to operation in which the high resistance writing voltage and the low resistance writing voltage having different polarities are applied to the variable resistance element 10 to cause resistance change in the variable resistance element 10. In the bipolar operation, typically, the absolute value of the low resistance writing voltage is smaller than the absolute value of the high resistance writing voltage at the effective voltage applied to the variable resistance element 10 alone.

In the bipolar operation, it is conceived that by applying voltages having different polarities to the variable resistance element 10, oxygen ions in the variable resistance layer migrate, causing the resistance change. In the example shown in FIG. 1, the resistance change is believed to occur due to the migration of oxygen ions between the second electrode 4 and the second tantalum oxide layer 3b of the variable resistance layer 3. For example, when a positive voltage is applied to the second electrode 4, negatively charged oxygen ions migrate to the second electrode 4, raising the oxygen concentration of the second tantalum oxide layer 3b (oxygen vacancy concentration decreases). As a result, the resistance state of the variable resistance layer 3 changes to the high resistance state. In contrast, when a negative voltage is applied to the second electrode 4, oxygen ions migrate away from the second electrode 4, lowering the oxygen concentration of the second tantalum oxide layer 3b (oxygen vacancy concentration increases). As a result, the resistance state of the variable resistance layer 3 changes to the low resistance state.

The bipolar operation is caused by increase or decrease of the oxygen concentration (oxygen vacancy concentration) at an interface between the second electrode 4 and the second tantalum oxide layer 3b. Thus, for stable operation, it is preferable that the top and the bottom configurations are asymmetry as shown in FIG. 1. For example, it is assumed that the variable resistance layer previously has a two-layer configuration including the second tantalum oxide layer 3b which is a $Ta_2O_5$ layer (a high resistance layer) having high oxygen concentration and low resistance, and the first tantalum oxide layer 3a, which is a TaO layer (a low resistance layer) having low oxygen concentration and low resistance. This configuration effectively applies the voltage to the second tantalum oxide layer 3b, and the resistance change preferentially occurs near an electrode interface on the side of the second tantalum oxide layer 3b. In this case, when the positive voltage is applied to the second electrode 4 in contact with the second tantalum oxide layer 3b, oxygen ions migrate to the electrode interface and the resistance state changes to the high resistance state.

In the present embodiment, the variable resistance element which performs the bipolar operation is employed. The driving method according to the present embodiment, as described below, solves a conflict problem between the resistance change to the high resistance state which is caused by oxygen ions migrating to an electrode in the bipolar variable resistance element involving the migration of oxygen ions, and the resistance change to the low resistance state caused by the dielectric breakdown, and stabilizes the resistance value of the variable resistance element. Specifically, in the high resistance write process, one change of the resistance state of the variable resistance element to the high resistance state is completed by supplying twice or more the high resistance writing voltage pulse that has the positive polarity.

Figure 3:
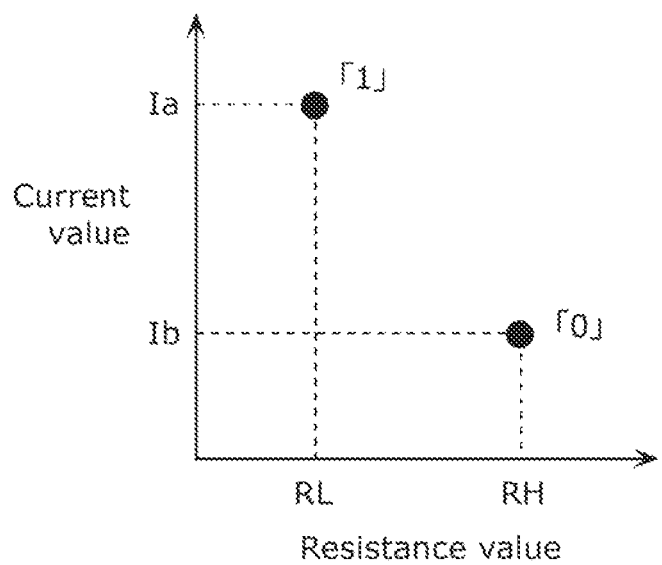
FIG. 3 is a diagram showing the relationship between a value of a current flowing through a circuit, which includes the variable resistance element according to the embodiment 1 of the present invention and a resistance value of a variable resistance layer upon readout of data.

The data written in the manner as described above is read out as follows. FIG. 3 is a diagram showing the relationship between a value of the current flowing through a circuit which includes the variable resistance element 10 according to the embodiment 1 of the present invention and the resistance value of the variable resistance layer 3 upon read out of the data.

When a read voltage pulse (for example, a voltage pulse of ±0.5 V) is supplied to the second terminal 12, a current dependent on the resistance value of the variable resistance layer 3 flows through the circuit. In other words, as shown in FIG. 3, when the variable resistance layer 3 is in a low resistance state RL, a current having a value Ia flows through the circuit, and when the variable resistance layer 3 is in a high resistance state RH, a current having a value Ib flows through the circuit. Thus, if the read voltage pulse is supplied to the second terminal 12 at which time the detected value of the current flowing between the first terminal 11 and the second terminal 12 is Ia, it is determined that the variable resistance layer 3 is in the low resistance state RL. In this case, it is observed that the data written to the variable resistance element 10 is "1." On the other hand, if the detected value of the current is Ib, it can be determined that the variable resistance layer 3 is in the high resistance state RH. In this case, it is observed that the data written to the variable resistance element 10 is "0." Here, the application of the read voltage pulse to the variable resistance element 10 does not change the resistance state of the variable resistance element 10.

The resistance value of the variable resistance element 10 according to the present embodiment does not change even if the power is turned off. Thus, the nonvolatile memory device can be achieved by employing the variable resistance element 10.

[Low Resistance Write Process and High Resistance Write Process]

Hereinafter, details of the low resistance write process and the high resistance write process according to the above-described embodiment 1 of the present invention will be described.

Figure 4:
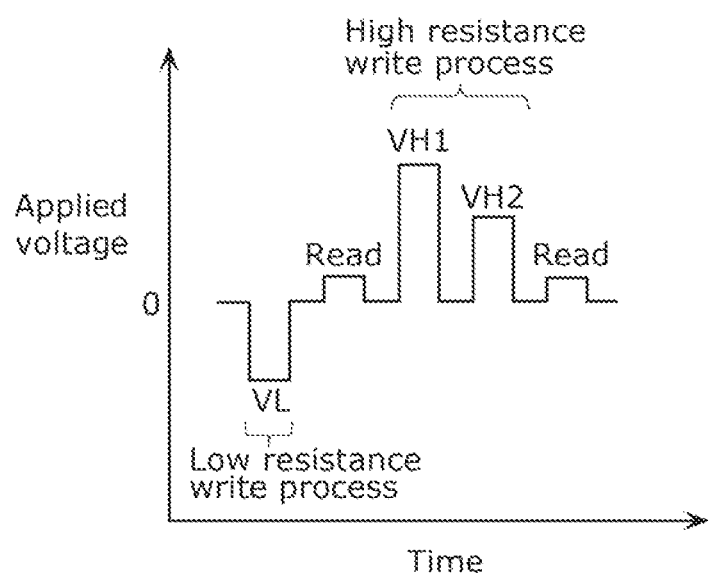
FIG. 4 is a diagram showing an exemplary operation of the variable resistance element according to the embodiment 1 of the present invention in a low resistance write process and in a high resistance write process.

FIG. 4 is a diagram showing exemplary operation of the variable resistance element 10 according to the embodiment 1 of the present invention in the low resistance write process and the high resistance write process. As shown in FIG. 4, in the low resistance write process, a low resistance writing voltage pulse of a voltage value VL is applied to the variable resistance element 10. On the other hand, in the high resistance write process, a first high resistance writing voltage pulse of a voltage value VH1 and a second high resistance writing voltage pulse of a voltage value VH2 are applied to the variable resistance element 10 in the stated order. Here, the relationship between the voltage value VH1 of the first high resistance writing pulse and the voltage value VH2 of the second high resistance writing pulse satisfies VH1>VH2. In other words, in the high resistance write process, the first high resistance writing voltage pulse of the voltage value VH1 and, sequentially, the second high resistance writing voltage pulse of the voltage value VH2 lower than the voltage value VH1 of the first high resistance writing voltage pulse are applied to the variable resistance element 10. It should be noted that the first high resistance writing voltage pulse refers to a high resistance writing voltage pulse that has the largest absolute value of the voltage among those when high resistance writing pulses are applied to the variable resistance element 10 multiple times.

The first high resistance writing voltage pulse is a pulse voltage which changes the variable resistance element 10 in the low resistance state to be in the high resistance state. The voltage value VH1 of the first high resistance writing voltage pulse is set to a relatively large value. This allows the application of sufficiently large voltage to the variable resistance element 10 in the resistance change operation even if the voltage value to be applied to the variable resistance element 10 alone decreases due to voltage distribution by the load resistance, for example, when the load resistance or the like is connected to the variable resistance element 10.

For example, when total of 2.4 V is applied to the variable resistance element 10 and the load resistance (see FIGS. 9 and 10), even if the resistance change to the high resistance state is caused at this voltage and the voltage is applied to the variable resistance element 10 alone, a large voltage ends up flowing through the variable resistance element 10. This causes defects (oxygen vacancies) in the second tantalum oxide layer 3b having the high resistance. Thus, the resistance change to the high resistance state may not be conducted sufficiently over the while area of the variable resistance element 10. Moreover, the resistance change to the high resistance state and the resistance change to the low resistance state that is due to the current and the occurrence of defects, concurrently occur in the variable resistance element 10, and the resistance value may be destabilized.

The second high resistance writing pulse is a voltage pulse for changing the state of the variable resistance element 10 (the variable resistance layer 3) that has large high resistance due to the first high resistance writing pulse to a stable high resistance state. The voltage value VH2 of the second high resistance writing voltage pulse is a relatively small value as compared to the voltage value VH1 of the first high resistance writing voltage pulse, and is set to a value sufficiently large to allow to change the resistance state of the variable resistance element 10 to the high resistance state. This can stabilize the high resistance state. This is believed to be due to a fact that the second high resistance writing pulse heals the defects caused by the first high resistance writing pulse.

Since the variable resistance element 10 has large high resistance due to the first high resistance writing pulse, when the second high resistance writing pulse is applied to the variable resistance element 10, the voltage is effectively applied to the variable resistance element 10, without excessive current flowing through the variable resistance element 10. Thus, it is believed that applying the second high resistance writing pulse to the variable resistance element 10 changes the variable resistance element 10 (the variable resistance layer 3) so that oxygen ions fills the defects (oxygen vacancies) caused by the first high resistance writing pulse. This can stabilize the high resistance state of the variable resistance element 10 should be noted that "Read" in FIG. 4 means a read voltage pulse (a voltage pulse of +0.5 V, for example). By supplying the read voltage pulse, it can be determined, as described above, whether the variable resistance layer 3 is in the high resistance state or in the low resistance state, and the data can be read out.

Figure 5:
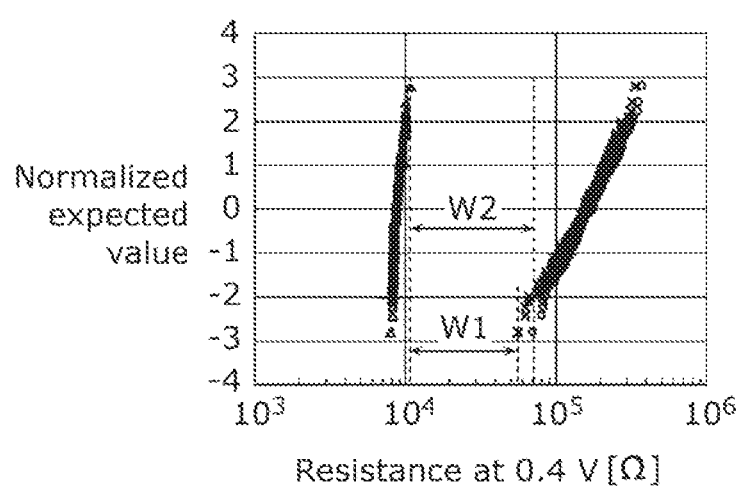
FIG. 5 is a plot of normalized expected values of the resistance value of the variable resistance layer included in the variable resistance element according to the embodiment 1 of the present invention.

FIG. 5 is a plot of normalized expected values of the resistance value of the variable resistance layer 3 included in the variable resistance element 10 according to the embodiment 1 of the present invention. In FIG. 5, the resistance value (where a resistance measuring voltage is +0.4 V) of the variable resistance layer 3 is indicated on the horizontal axis, and normalized expected values indicative of the degree of variation in the resistance value upon normal distribution fitting are indicated on the vertical axis.

The data shown in FIG. 5 is obtained by repeating the low resistance write process and the high resistance write process for 100 times (likewise in subsequent plots of other normalized expected values). Here, in the low resistance write process, the low resistance writing voltage pulse of −1.5 V is applied to the variable resistance layer 3, and in the high resistance write process, a voltage pulse of +2.4 V as the first high resistance writing voltage pulse and a voltage pulse of +1.5 V as the second high resistance writing voltage pulse are applied to the variable resistance layer 3. Data obtained by applying the voltage pulse of −1.5 V to the variable resistance layer 3 is indicated by open triangles. Data obtained by applying only the first high resistance writing voltage pulse to the variable resistance layer 3 is indicated by crosses. Data obtained by applying the first high resistance writing voltage pulse and further the second high resistance writing voltage pulse to the variable resistance layer 3 is indicated by open circles.

To accurately read out the written data, it is desirable that window which is defined by a difference between a minimum of the resistance value in the high resistance state and a maximum of the resistance value in the low resistance state is large. As shown in FIG. 5, comparing a window W1 when only the first high resistance writing voltage pulse (+2.4 V) is applied to the variable resistance layer 3 and a window W2 when the first high resistance writing voltage pulse (+2.4 V) and then the second high resistance writing voltage pulse (+1.5 V) are applied to the variable resistance layer 3, W2 is larger than W1. This suggests that applying, in sequence, the first high resistance writing voltage pulse of the voltage value VH1 and the second high resistance writing voltage pulse of the voltage value VH2 (VH1>VH2) to the variable resistance layer 3 in the stated order in the high resistance write process can achieve more stable storage operation.

Figure 6A:
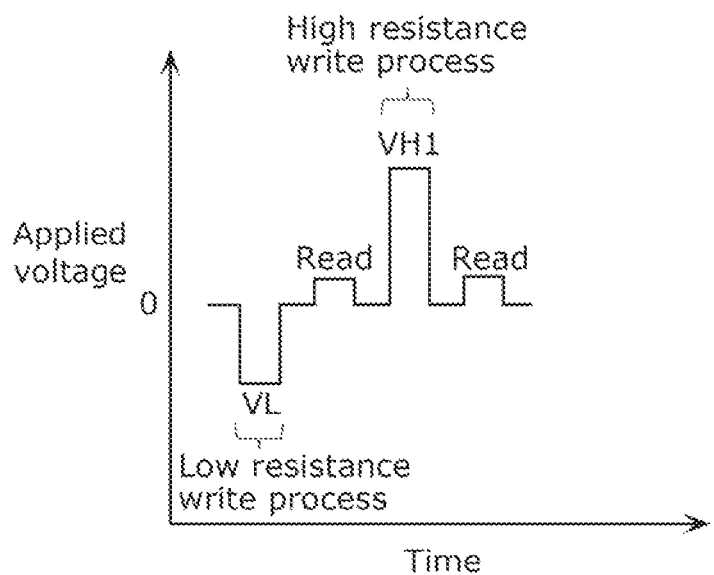
FIG. 6A is a diagram showing an exemplary operation of a variable resistance element according to Reference Example 1.
Figure 6B:
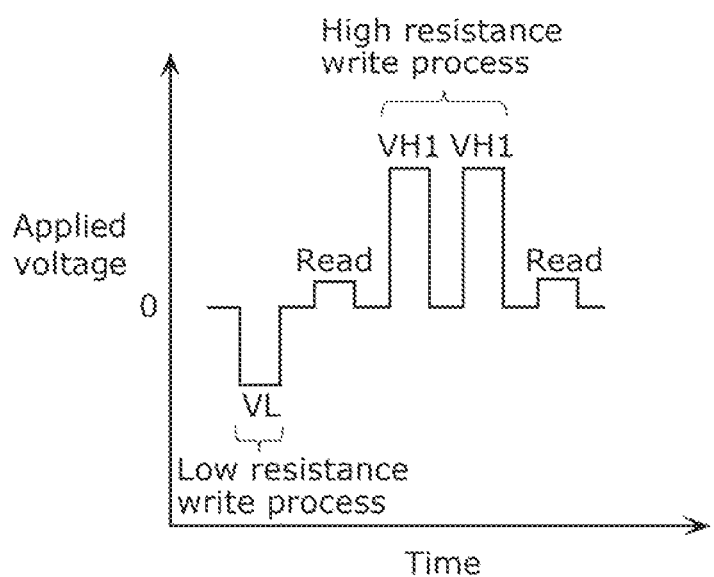
FIG. 6B is a diagram showing an exemplary operation of a variable resistance element according to Reference Example 2.

Here, the driving method according to the present embodiment is contrasted with other driving methods, and the superiority of the present embodiment over the other driving methods will be described, Reference Example 1 and Reference Example 2 will be described below as the contrasted driving methods, FIG. 6A is a diagram showing exemplary operation of a variable resistance element according to Reference Example 1, and FIG. 6B is a diagram showing exemplary operation of a variable resistance element according to Reference Example 2. It should be noted that the configurations of the variable resistance elements according to Reference Example 1 and Reference Example 2 are the same as that of the variable resistance element 10 according to the present embodiment.

As shown in FIG. 6A, in Reference Example 1, a low resistance writing voltage pulse of the voltage value VL is applied to the variable resistance layer 3 in the low resistance write process and the first high resistance writing voltage pulse of the voltage value VH1 is applied to the variable resistance layer 3 in the high resistance write process. As shown in FIG. 6B, in Reference Example 2, the low resistance writing voltage pulse of the voltage value VL is applied to the variable resistance layer 3 in the low resistance write process, and the first high resistance writing voltage pulse of the voltage value VH1 is applied twice in sequence to the variable resistance layer 3 in the high resistance write process. Here, VL=−1.5 V and VH1=+2.4 V are satisfied.

Figure 7A:
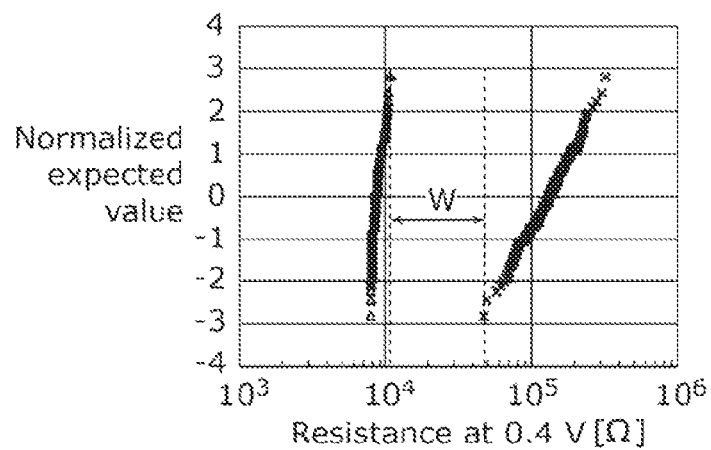
FIG. 7A is a plot of normalized expected values of a resistance value of a variable resistance layer included in the variable resistance element according to Reference Example 1.
Figure 7B:
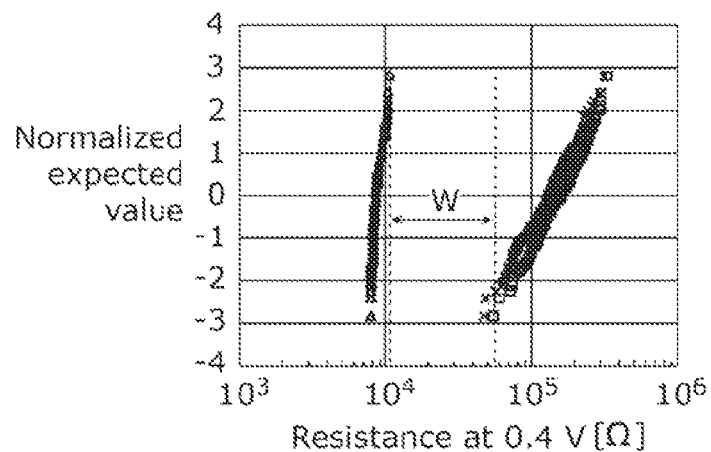
FIG. 7B is a plot of normalized expected values of a resistance value of a variable resistance layer included in the variable resistance element according to Reference Example 2.
Figure 7C:
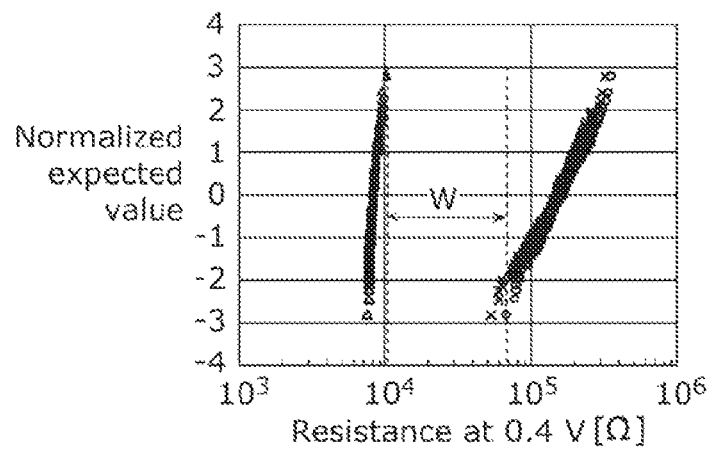
FIG. 7C is a plot of the normalized expected values of the resistance value of the variable resistance layer included in the variable resistance element according to the embodiment 1 of the present invention.

FIG. 7A is a plot of normalized expected values of the resistance value of a variable resistance layer included in the variable resistance element according to Reference Example 1, FIG. 7B is a plot of normalized expected values of the resistance value of a variable resistance layer included in the variable resistance element according to Reference Example 2, and FIG. 7C is a plot of the normalized expected values of the resistance value of the variable resistance layer included in the variable resistance element according to the present embodiment. As with FIG. 5, in FIGS. 7A through 7C, the resistance value (where a resistance measuring voltage is +0.4 V) of the variable resistance layer 3 is indicated on the horizontal axis, and the normalized expected values indicative of the degree of variation in the resistance value upon normal distribution fitting are indicated on the vertical axis. It should be noted that FIG. 7C shows the same graph as shown in FIG. 5. In FIGS. 7A through 7C, data obtained by applying the low resistance writing voltage pulse of −1.5 V to the variable resistance layer 3 is indicated by open triangles. In FIG. 7A, data obtained by applying the first high resistance writing voltage pulse (+2.4 V) to the variable resistance layer 3 is indicated by crosses. In FIG. 7B, data obtained by applying the first high resistance writing voltage pulse (+2.4 V) to the variable resistance layer 3 is indicated by crosses, and data obtained by applying the first high resistance writing voltage pulse (+2.4 V) and then further the first high resistance writing voltage pulse (+2.4 V) to the variable resistance layer 3 is indicated by open squares. Furthermore, in FIG. 7C, data obtained by applying the first high resistance writing voltage pulse (+2.4 V) to the variable resistance layer 3 is indicated by crosses, and data obtained by applying the first high resistance writing voltage pulse (+2.4 V) and then further the second high resistance writing voltage pulse (+1.5 V) to the variable resistance layer 3 is indicated by open circles. As can be seen from FIGS. 7A through 7C, the windows W in FIGS. 7A, 7B, and 7C are about 35 kΩ, about 50 kΩ, and about 70 kΩ, respectively.

Figure 8:
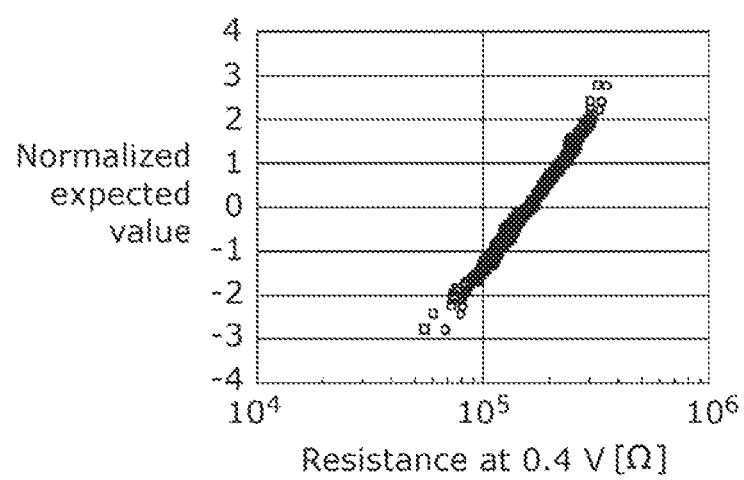
FIG. 8 is a plot of the normalized expected values of the resistance value of the variable resistance layer the high resistance state which is included in the variable resistance element according to the embodiment 1 and Reference Example 2.

Referring to FIG. 7A through FIG. 7C, it can be observed that the present embodiment 1 can assure larger window W than Reference Example 1, and Reference Example 2. To get a better picture in this respect, the normalized expected values of the resistance values of the variable resistance layers in the high resistance state in Reference Example 2 and the embodiment 1 are collectively depicted in FIG. 8. In FIG. 8, data indicated by open squares in FIG. 7B and data indicated by open circles in FIG. 7C are compared on the same graph.

Referring to FIG. 8, it can be observed that the present embodiment (data indicated by open circles) where the second high resistance writing voltage pulse (+1.5V) is applied as the second high resistance writing voltage pulse to the variable resistance layer 3 has a larger minimum of the high resistance value as compared with Reference Example 2 (data indicated by open squares) where a high resistance writing voltage pulse which is the same as the first high resistance writing voltage pulse (+2.4V) is applied as the second high resistance writing voltage pulse to the variable resistance layer 3, thereby ensuring a larger window. Moreover, turning to near the minimum of the resistance value, while the resistance value in Reference Example 2 varies extending in the horizontal direction, the resistance value in the present embodiment does not so vary extending in the horizontal direction and improved expansion of, what is called, a tail bit (the edge of the distribution) can be observed in the present embodiment. Since the voltage value of the second high resistance writing voltage pulse is +1.5 V in the present embodiment while the voltage value of the second high resistance writing voltage pulse is +2.4 V in Reference Example 2, the present embodiment can reduce greater current consumption in the high resistance write process than Reference Example 2. Thus, in view of power conservation effect also, the present embodiment is superior to Reference Example 2.

[Applied Voltage in High Resistance Write Process]

Figure 9:
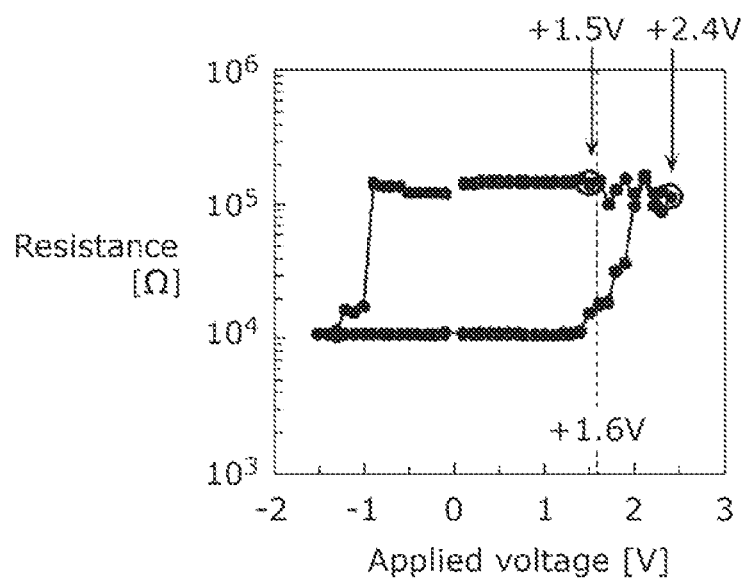
FIG. 9 is a graph depicting the resistance-voltage characteristics of the variable resistance element according to the embodiment 1 of the present invention.
Figure 10:
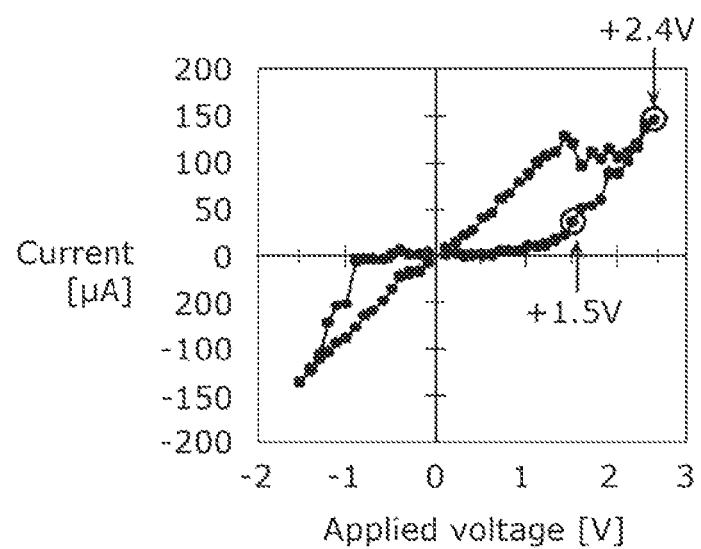
FIG. 10 is a graph depicting the current-voltage characteristics of the variable resistance element according to the embodiment 1 of the present invention.

As described above, in the present embodiment, the high resistance writing voltage pulse of the voltage value VH1 and the high resistance writing voltage pulse of the voltage value VH2 (VH1>VH2) are applied in sequence to the variable resistance layer 3 in the stated order. This allows for the accurate determination as to whether the resistance state of the variable resistance layer is the high resistance state or the low resistance state, thereby achieving the stable operation. The fact that such effects are obtained by satisfying the condition VH1>VH2 is as described above. For the purpose of achievement of further stable operation, however, VH2 is believed to have a desirable range. The desirable range has been considered and described below, FIG. 9 is a graph depicting the resistance-voltage characteristics of the variable resistance element 10 according to the embodiment 1 of the present invention. FIG. 10 is a graph depicting the current-voltage characteristics of the variable resistance element 10 according to the embodiment 1 of the present invention. It should be noted that the data shown in FIG. 9 and FIG. 10 does not depict the resistance-voltage characteristics of the variable resistance element 10 alone, and is obtained by applying voltages in a range of −1.5 V through +2.4 V to the variable resistance layer 3 when the load resistance having the resistance value of 1 kΩ is electrically connected to the variable resistance layer 3 in series.

Referring to FIG. 9, it can be seen that there is a portion where the resistance value in the high resistance state widely varies. Specifically, the resistance value widely varies when the applied voltage is +1.6 V or greater. This is considered to be due to a fact that the application of the voltage pulse to the variable resistance layer 3 causes conflict between the resistance change to the high resistance state which is caused by atomic oxygen in the variable resistance layer 3 being turned to ions and migrating to the second electrode 4 and the resistance change to the low resistance state caused by the dielectric breakdown, ending up destabilizing the resistance value. In view of these characteristics, it is desirable that the voltage value VH2 of the second high resistance writing voltage puke is less than +1.6 V. As described above, VH2 is equal to +1.5 V which is less than +1.6 V in the present embodiment. In this case, as shown in FIG. 10, the current consumption is sufficiently small. Thus, the power conservation effect can be improved. Moreover, a threshold voltage for causing the resistance change in the variable resistance layer to the high resistance state is generally about +0.5 through about +0.7 V (described in FIG. 11 below). Thus, it is conceived that the applied voltage in the high resistance write process is greater than the threshold voltage.

From the above, preferably, the total of the voltage value VH2 of the high resistance writing voltage pulse to be applied second time to both the variable resistance layer 3 and the load resistance is greater than +0.7 and less than +1.6 V.

Figure 11:
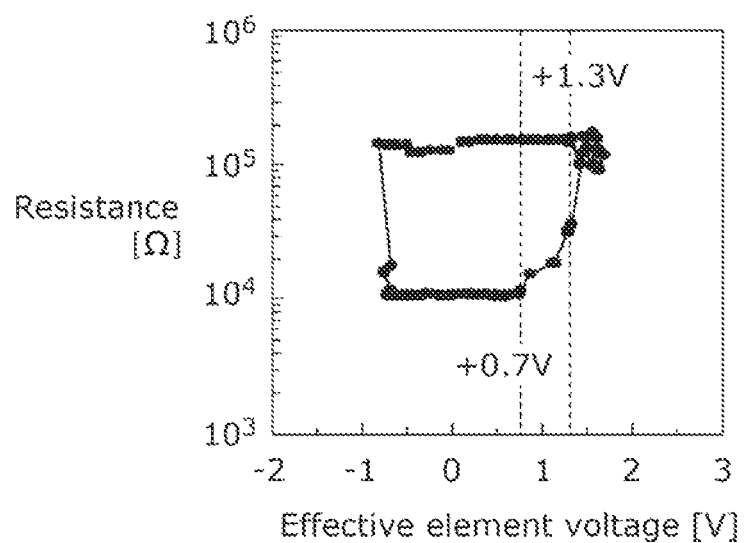
FIG. 11 is a graph depicting the resistance-voltage characteristics of the variable resistance element alone according to the embodiment 1 of the present invention.
Figure 12:
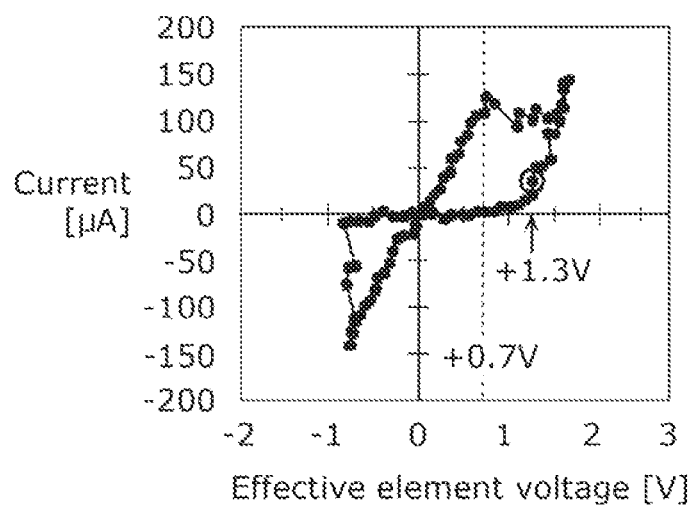
FIG. 12 is a graph depicting the current-voltage characteristics of the variable resistance element according to the embodiment 1 alone of the present invention.

FIG. 11 is a graph depicting the resistance-voltage characteristics of the variable resistance element 10 alone according to the embodiment 1 of the present invention, and FIG. 12 is a graph depicting the current-voltage characteristics of the variable resistance element 10 alone also.

As shown in FIG. 11, when the voltage is applied to the element alone excluding the load resistance, it can be observed that the resistance value widely varies in the high resistance state when the applied voltage is +1.3 V or greater. Thus, preferably, VH2 is less than +1.3 V. In this case, as shown in FIG. 12, the current consumption is sufficiently small. Thus, the power conservation effect can be improved. Moreover, the resistance change to the high resistance state is seen when the applied voltage is over +0.7 V. Thus, desirably, the applied voltage in the high resistance write process is greater than +0.7 V.

From the foregoing, when the voltage is applied to the element alone, preferably, the voltage value VH2 of the second high resistance writing voltage pulse to be applied to the variable resistance layer 3 is greater than +0.7 V and less than +1.3 V. [Number of Applications of Voltage in High Resistance Write Process]

Figure 13:
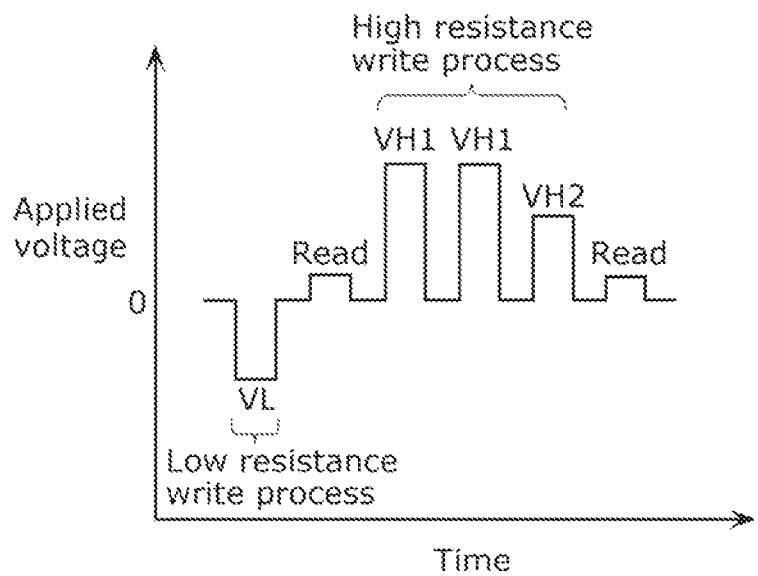
FIG. 13 is a diagram showing another exemplary operation of the variable resistance element according to the embodiment 1 of the present invention in the low resistance write process and the high resistance write process.

As described above, in the present embodiment, while the total of two high resistance writing voltage pulses (the first high resistance writing voltage pulse and the following second high resistance writing voltage pulse) are applied in the high resistance write process, the number times the high resistance writing voltage pulse is applied may be three or more. FIG. 13 is a diagram showing another exemplary operation of the variable resistance element 10 according to the embodiment 1 of the present invention in the low resistance write process and the high resistance write process.

As shown in FIG. 13, in the low resistance write process, the low resistance writing voltage pulse of the voltage value VL is supplied to the variable resistance element 10. On the other hand, in the high resistance write process, the first high resistance writing voltage pulse of the voltage value VH1 (for example, +2.4 V) is applied twice in sequence, and then the second high resistance writing voltage pulse of the voltage value VH2 (for example, +1.5 V) is applied to the variable resistance element 10. In other words, in the high resistance write process, the high resistance writing voltage pulse is applied to the variable resistance element 10 total of three times where the voltage value of the second high resistance writing voltage pulse is lower than the voltage value of the first high resistance writing voltage pulse that is applied to the variable resistance element 10 prior to the second high resistance writing voltage pulse. In such a manner, when the voltage value of the second high resistance writing voltage pulse to be applied after applying the first high resistance writing voltage pulse to the variable resistance element 10 is lower than the voltage value of the first high resistance writing voltage pulse that is to be applied to the variable resistance element 10 prior to the second high resistance writing voltage pulse, the tail bit in the high resistance state is improved as with the case described above, and a sufficiently large window can be ensured.

It should be noted that, when the high resistance writing voltage pulse is applied to the variable resistance element 10 more than three times in the high resistance write process as described above, certain effect is believed to be observed if the first high resistance writing voltage pulse of the voltage value (VH1) an absolute value of which is a greatest and then the second high resistance writing voltage pulse (the voltage value VH2<VH1) are applied to the variable resistance element 10. Thus, for example, an embodiment is envisioned where the high resistance writing voltage pulses of +2.0 V and +2.4 V are applied to the variable resistance element 10 in the stated order and then a high resistance writing voltage pulse of +1.5 V is applied to the variable resistance element 10.

Hereinafter, the effects of applying the high resistance writing voltage pulses to the variable resistance element 10 three times will be ascertained.

Figure 14:
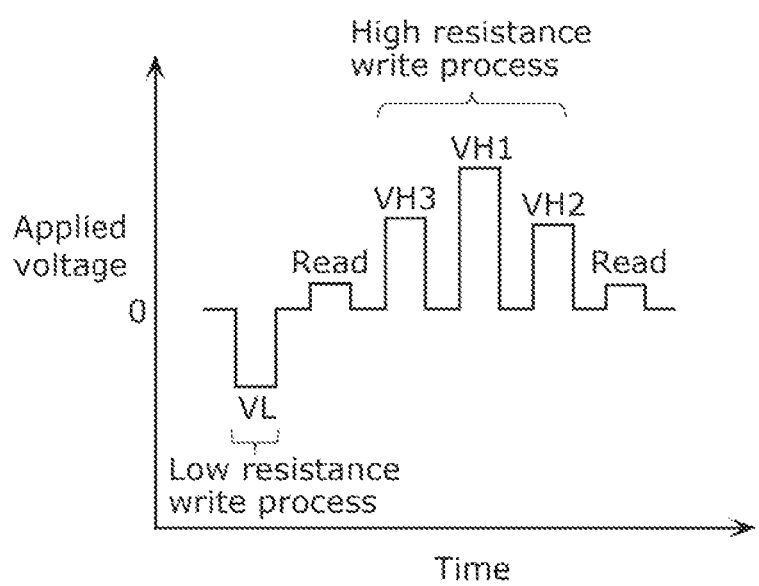
FIG. 14 is a diagram showing another exemplary operation of the variable resistance element according to the embodiment 1 of the present invention in the low resistance write process and the high resistance write process.

In the exemplary operation shown in FIG. 14, a third high resistance writing voltage pulse of a voltage value VH3 (VH3<VH1), then the first high resistance writing voltage pulse of the voltage value VH1 higher than VH3, and further then the second high resistance writing voltage pulse of the voltage value VH2 (VH2<VH1) are applied to the variable resistance element 10 in the high resistance write process. In the exemplary operation, there is a pair of the first high resistance writing voltage pulse having a highest voltage value (VH1) and the second high resistance writing voltage pulse which has the voltage value (VH2) lower than the highest voltage value (VH1) and is applied to the variable resistance element 10 subsequently to the first high resistance writing voltage pulse.

Figure 15:
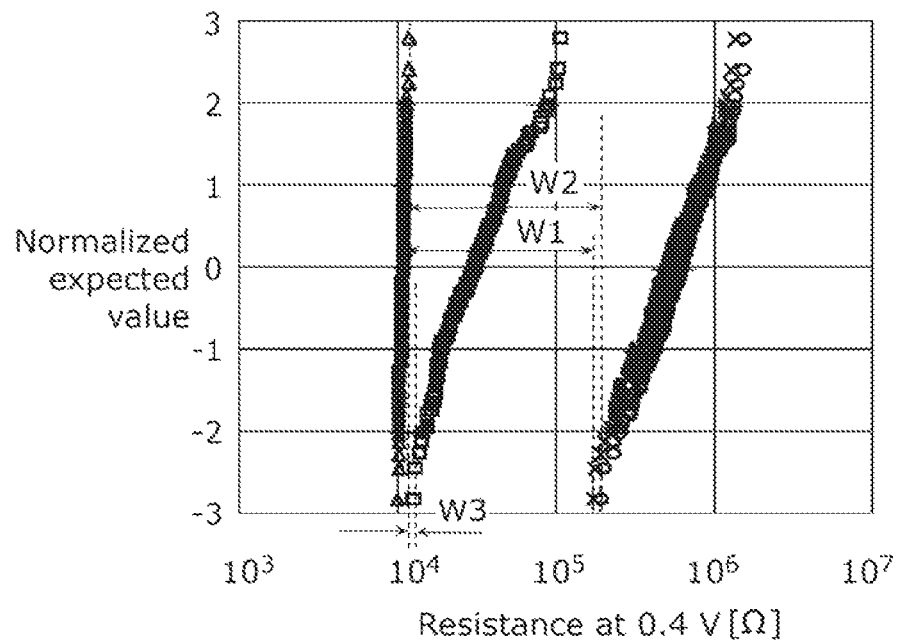
FIG. 15 is a plot of the normalized expected values of the resistance value of the variable resistance layer included in the variable resistance element according to the embodiment 1 of the present invention.

FIG. 15 is a plot of normalized expected values of the resistance value of the variable resistance layer 3 when VH3 and VH2 are both +1.5 V and VH1 is +2.4 V in the above exemplary operation, that is, when the high resistance writing voltage pulses of +1.5 V, +2.4 V, and +1.5 V are applied to the variable resistance layer 3 in the stated order. In FIG. 15, the case where only the third high resistance writing voltage pulse of +1.5 V (VH3) to be applied initially is applied to the variable resistance layer 3 is plotted as open squares, the case where the third high resistance writing voltage pulse and then the first high resistance writing voltage pulse (VH1=+2.4 V) are applied to the variable resistance layer 3 is plotted as crosses, and the case where the third high resistance writing voltage pulse to be applied initially, the first high resistance writing voltage pulse (VH1=+2.4 V), and then further the second high resistance writing voltage pulse having +1.5 V (VH2) are applied to the variable resistance layer 3 is plotted as open circles.

As shown in FIG. 15, comparing a window W3 when the third high resistance writing voltage pulse of +1.5 V to be applied initially is applied to the variable resistance layer 3, the window W1 when the third high resistance writing voltage pulse of +1.5 V to be applied initially and then the first high resistance writing voltage pulse of +2.4 V are applied to the variable resistance layer 3, and the window W2 when the third high resistance writing voltage pulse of +1.5 V to be applied initially, then the first high resistance writing voltage pulse of +2.4 V, and further then the second high resistance writing voltage pulse of +1.5 V to be applied last are applied to the variable resistance layer 3, W2 is the largest. As such, it is ascertained that the largest window can be assured when the first high resistance writing voltage pulse (the voltage value VH1) and then the second high resistance writing voltage pulse (the voltage value VH2) are applied to the variable resistance layer 3.

Further variation is also possible. For example, in the exemplary operation shown in FIG. 16, the first high resistance writing voltage pulse of the voltage value VH1, then the third high resistance writing voltage pulse of the voltage value VH3 lower than VH1, and further then the second high resistance writing voltage pulse of the voltage value VH2 that is lower than VH1 and higher than VH3 are applied to the variable resistance element 10 in the high resistance write process. In the exemplary operation also, there is a pair of the first high resistance writing voltage pulse having a highest voltage value (VH1) and the second high resistance writing voltage pulse which has the voltage value (VH2) lower than the highest voltage value (VH1) and is applied to the variable resistance element 10 subsequently to the first high resistance writing voltage pulse.

Figure 16:
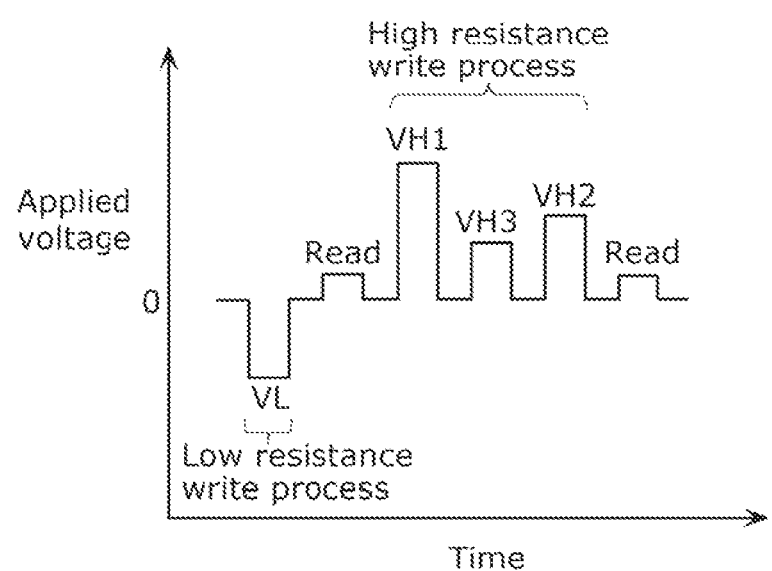
FIG. 16 is a diagram showing another exemplary operation of the variable resistance element according to the embodiment 1 of the present invention in the low resistance write process and the high resistance write process.
Figure 17:
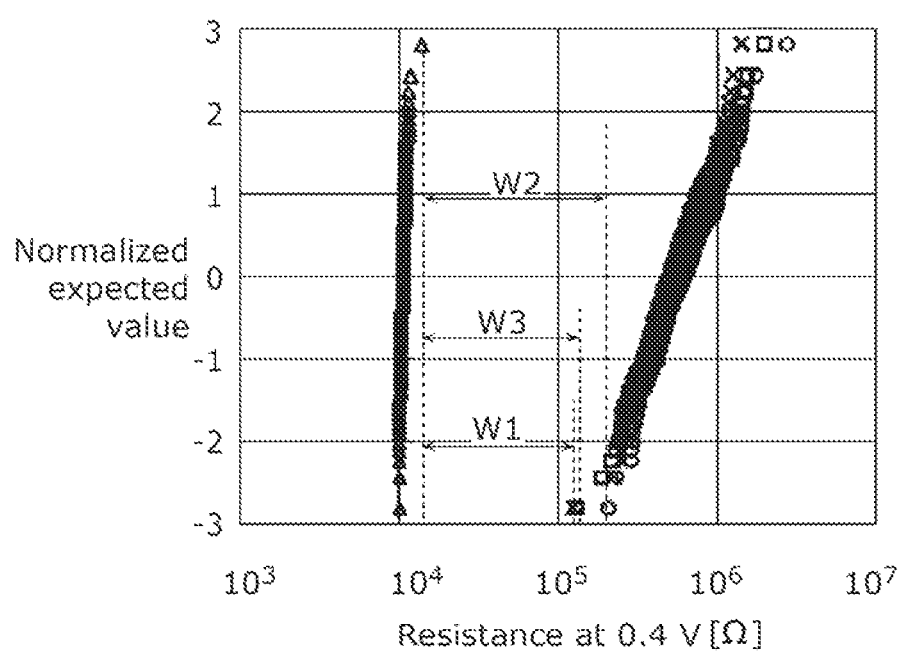
FIG. 17 is a plot of the normalized expected values of the resistance value of the variable resistance layer included in the variable resistance element according to the embodiment 1 of the present invention.

FIG. 17 is a plot of normalized expected values of the resistance value of the variable resistance layer 3 when VH1 is +2.4 V, VH2 is +1.5 V, and VH3 is +0.8 V in the above exemplary operation shown in FIG. 16, that is, when the high resistance writing voltage pulses of +2.4 V, +0.8 V, and +1.5 V are applied to the variable resistance layer 3 in the stated order. In FIG. 17, the case where the first high resistance writing voltage pulse of +2.4 V (VH1) initially applied to the variable resistance layer 3 is plotted as crosses, the case where the first high resistance writing voltage pulse and then the third high resistance writing voltage pulse of +0.8 V (VH3) are applied to the variable resistance layer 3 is plotted as open squares, and the case where the second high resistance writing voltage pulse of +1.5 V (VH2) is applied to the variable resistance layer 3 subsequently to the first high resistance writing voltage pulse and the third high resistance writing voltage pulse is plotted as open circles.

As shown in FIG. 17, comparing the window W1 when the first high resistance writing voltage pulse of +2.4 V to be applied initially is applied to the variable resistance layer 3, the window W3 when the first high resistance writing voltage pulse of +2.4 V to be applied initially and then the third high resistance writing voltage pulse of +0.8 V are applied to the variable resistance layer 3, and the window W2 when the first high resistance writing voltage pulse of +2.4 V to be applied initially, the third high resistance writing voltage pulse of +0.8 V, and then the second high resistance writing voltage pulse of +1.5 V to be applied last are applied to the variable resistance layer 3, W2 is the largest. As such, referring to FIG. 17, in the exemplary operation also, it is ascertained that the largest window can be assured when the second high resistance writing voltage pulse of VH2 is applied to the variable resistance layer 3.

Embodiment 2

A nonvolatile memory device according to an embodiment 2 is 1 transistor/1 resistance (1T1R) nonvolatile memory device in which memory cells which are base units are connected in series to a transistor and a nonvolatile memory device, and includes the variable resistance elements described in the embodiment 1. Hereinafter, the configuration and operation of the nonvolatile memory device will be described.

[Configuration and Operation of Nonvolatile Memory Device]

Figure 18:
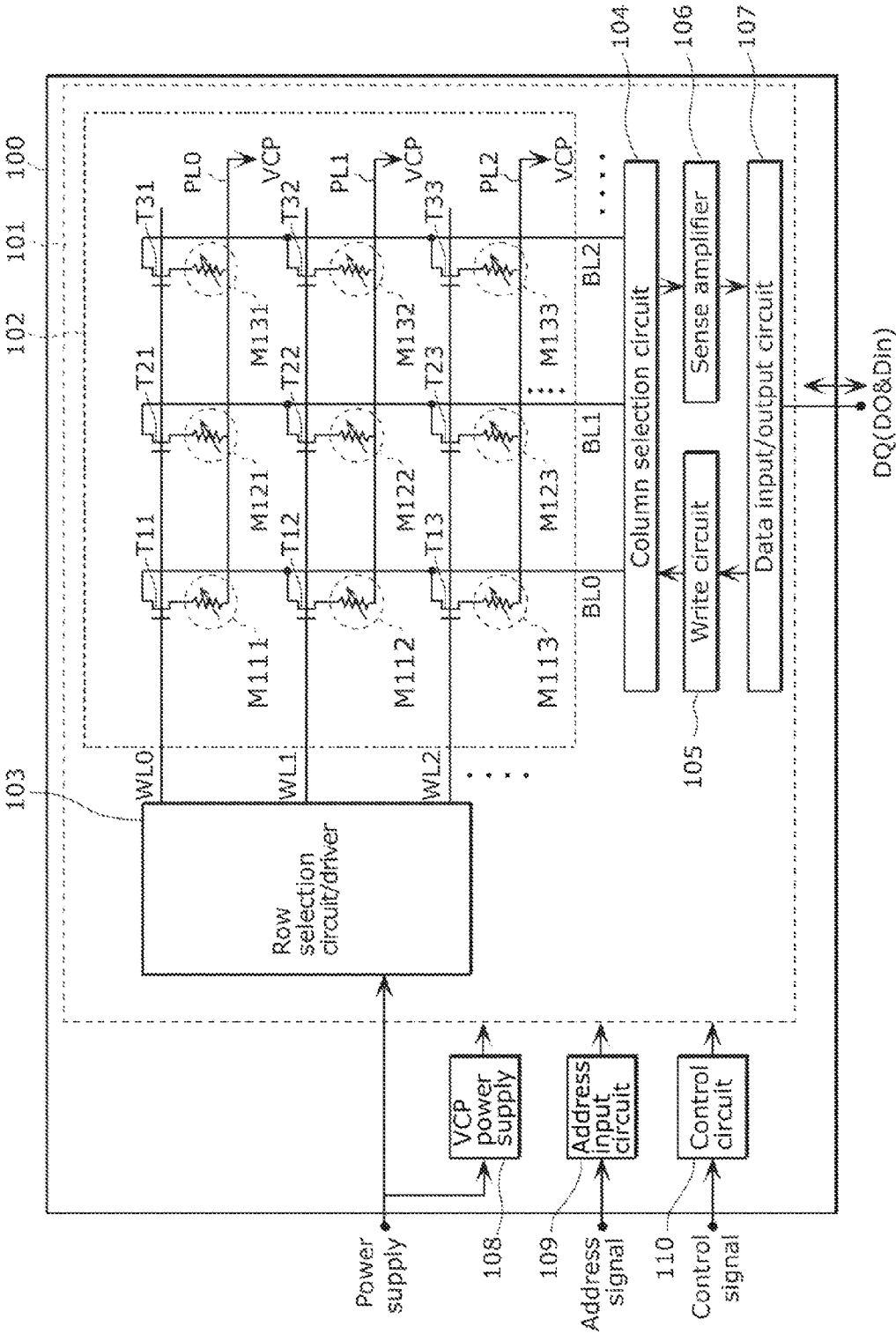
FIG. 18 is a block diagram of an example configuration of a nonvolatile memory device according to an embodiment 2 of the present invention.

FIG. 18 is a block diagram of an example configuration of the nonvolatile memory device according to the present embodiment. As shown in FIG. 18, a nonvolatile memory device 100 which is of 1T1R includes a memory main portion 101 on a semiconductor substrate. The memory main portion 101 includes a memory array 102, a row selection circuit/driver 103, a column selection circuit 104, a write circuit 105 for writing information, a sense amplifier 106 which detects an amount of current flowing through a selected bit line to determine which quaternary data item is stored, and a data input/output circuit 107 which performs input and output processing of input and output data via a terminal DQ.

The nonvolatile memory device 100 further includes a cell plate power supply (VCP power supply) 108, an address input circuit 109 which receives an address signal inputted from the outside, and a control circuit 110 which controls the operation of the memory main portion 101 based on a control signal inputted from the outside.

A memory array 102 includes a plurality of word lines WL0, WL1, WL2, and so on and the bit lines BL0, BL1, BL2, and so on which are arranged crossing (for example, perpendicular to) each other, a plurality of transistors T11, T12, T13, T21, T22, T23, T31, T32, T33, and so on (hereinafter, represented by "transistors T11, T12, and so on") provided in correspondence with cross-points between the word lines WL0, WL1, WL2, and so on and the bit lines BL0, BL1, BL2, and so on, and a plurality of memory cells M111, M112, M113, M121, M122, M123, M131, M132, M133 (hereinafter, represented by "memory cells M111, M112, and so on") provided in one-to-one correspondence with the respective transistors T11, T12, and so on, which are formed on the semiconductor substrate. Here, the memory cells M111, M112, and so on each correspond to the variable resistance element 10 according to the embodiment 1.

The memory array 102 includes a plurality of plate lines PL0, PL1, PL2, and so on arranged in parallel with the word lines WL0, WL1, WL2, and so on.

Drains of the transistors T11, T12, T13, and so on are connected to the bit line BL0, drains of the transistors T21, T22, T23, and so on are connected to the bit line BL1, and drains of the transistors T31, T32, T33, and so on are connected to the bit line BL2.

Gates of the transistors T11, T21, T31, and so on are connected to the word line WL0, gates of the transistors T12, T22, T32, and so on are connected to the word line WL1, and gates of the transistors T13, T23, T33, and so on are connected to the word line WL2.

Furthermore, sources of the transistors T11, T12, and so on are connected to the memory cells M111, M112, and so on, respectively.

The memory cells M111, M121, M131, and so on are connected to the plate line PL0, the memory cells M112, M122, M132, and so on are connected to the plate line PL1, and the memory cells M113, M123, M133, and so on are connected to the plate line PL2.

The address input circuit 109 receives an address signal from an external circuit (not shown), and based on the address signal, outputs a row address signal to the row selection circuit/driver 103 and outputs a column address signal to the column selection circuit 104. Here, an address signal is a signal indicative of an address of a specific memory cell selected from among the plurality of memory cells M111, M112, and so on. The row address signal is a signal indicative of a row address in the address indicated by the address signal, and the column address signal is a signal indicative of a column address in the address indicated by the address signal.

In an information write step (corresponding to the low resistance write process and the high resistance write process described above), the control circuit 110 outputs, to the write circuit 105, a write signal instructing application of a write voltage to a bit line, according to input data Din inputted to the data input/output circuit 107. On the other hand, in an information read step, the control circuit 110 outputs, to the column selection circuit 104, a read signal instructing application of read voltage.

The row selection circuit/driver 103, the column selection circuit 104, and the write circuit 105 forms a voltage pulse application device. The voltage pulse application device performs the low resistance write process and the high resistance write process described in the embodiment 1.

The row selection circuit, driver 103 receives the row address signal outputted from the address input circuit 109, and according to the row address signal, selects any of the plurality of word lines WL0, WL1, WL2, and so on, and applies a predetermined voltage to the selected word line.

The common selection circuit 104 receives the column address signal outputted from the address input circuit 109, and according to the column address signal, selects any of the plurality of bit lines BL0, BL1, BL2, and so on, and applies a write voltage or a read voltage to the selected bit line.

When received the write signal outputted from the control circuit 110, the write circuit 105 outputs a signal instructing the column selection circuit 104 to apply a write voltage to the selected bit line. Here, when writing a value corresponding to the resistance value in the low resistance state (the low resistance write process), the write circuit 105 outputs a signal instructing application of the low resistance writing voltage pulse of the voltage value VL. On the other hand, when writing a value corresponding to the resistance value in the high resistance state (the high resistance write process), the write circuit 105 outputs a signal instructing the application of a first high resistance writing voltage pulse of the voltage value VH1 and a second high resistance writing voltage pulse of the voltage value VH2 in the stated order. It should be noted that the polarity of the voltage herein corresponds to the polarity of the voltage applied to the variable resistance element, and is as the definition described in the embodiment 1.

In the information read step, the sense amplifier 106 detects an amount of current flowing through the selected bit line, from which data is to be read out, and determines the data stored therein. In the present embodiment, the resistance state of each of the memory cells M111, M112, and so on includes two states which are the high resistance state and the low resistance state, and each data is associated with a corresponding state. Thus, the sense amplifier 106 determines the resistance state of the variable resistance layer included in the selected memory cell, and according to the result, determines which binary data item is stored therein. The resultant output data DO is outputted to the external circuit via the data input/output circuit 10.

By operating as described above, the nonvolatile memory device 100 achieves stable storage operation.

While in the above configuration example, the plate lines are disposed in parallel with the word lines, the plate lines may be disposed in parallel with the bit lines. Moreover, while the plate lines are configured to provide a common potential to the plurality of transistors, a plate line selection circuit/driver having the same configuration as the row selection circuit/driver 103 may be employed and a selected plate line and an unselected plate line may be driven using different voltages (including the polarity).

Embodiment 3

A nonvolatile memory device according to an embodiment 3 is a cross-point nonvolatile memory device in which the memory cells are disposed at which the plurality of word lines and the plurality of bit lines arranged to cross each other are crossing each other. The nonvolatile memory device includes the variable resistance elements shown in the embodiment 1. Hereinafter, the configuration and operation of the nonvolatile memory device will be described.

[Configuration and Operation of Nonvolatile Memory Device]

Figure 19:
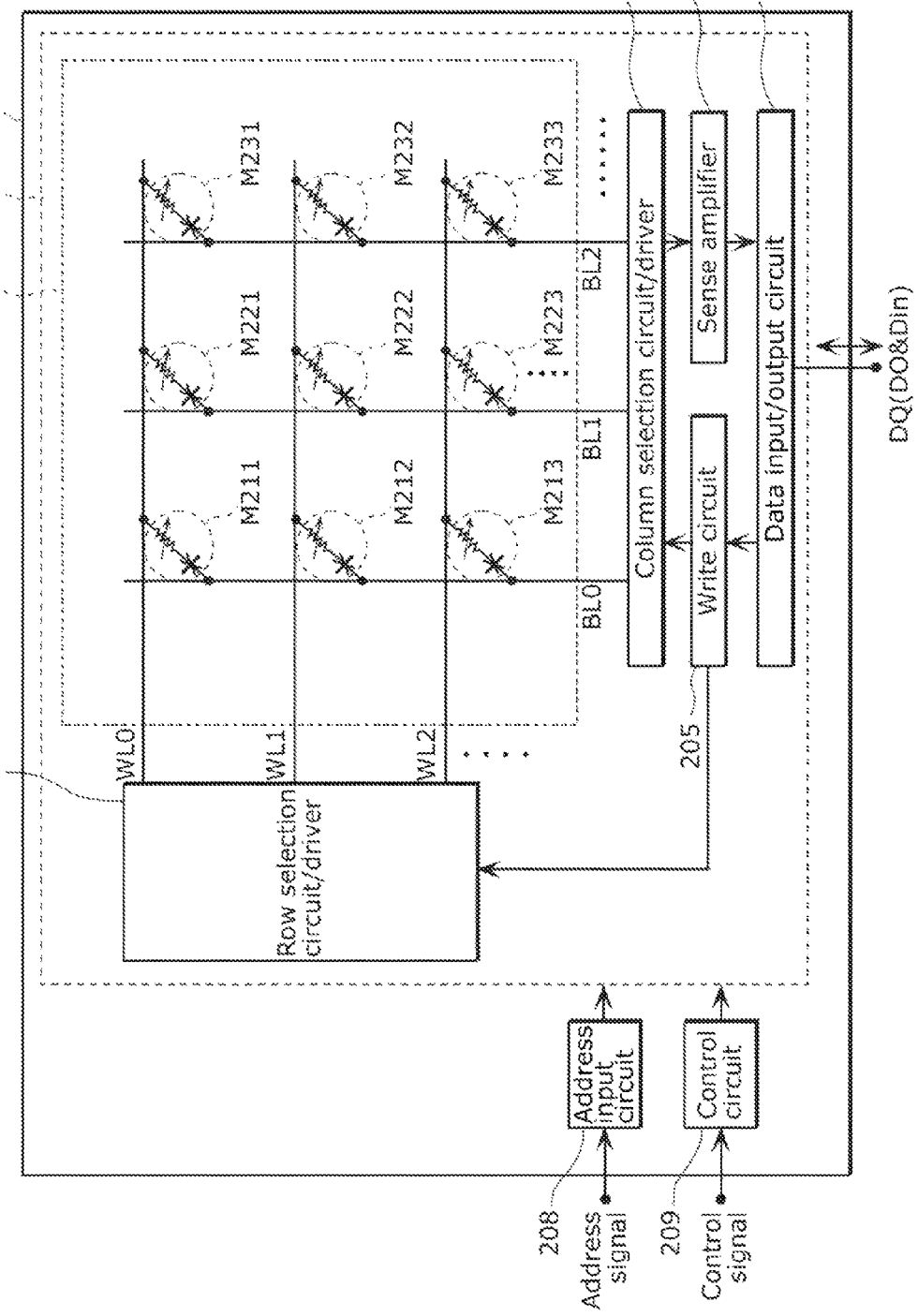
FIG. 19 is a block diagram of an example configuration of a nonvolatile memory device according to an embodiment 3 of the present invention.

FIG. 19 is a block diagram of an example configuration of the nonvolatile memory device according to the present embodiment. As shown in FIG. 19, a nonvolatile memory device 200 according to the present embodiment includes a memory main portion 201 on the semiconductor substrate. The memory main portion 201 includes a memory array 202, a row selection circuit/driver 203, a column selection circuit/driver 204, a write circuit 205 for writing information, a sense amplifier 206 which detects an amount of current flowing through the selected bit line to determine which quaternary data item is stored, and a data input/output circuit 207 which performs input and output processing of input and output data via the terminal DQ.

The nonvolatile memory device 200 further includes an address input circuit 208 which receives an address signal inputted from the outside, and a control circuit 209 which controls the operation of the memory main portion 201 based on a control signal inputted from the outside.

The memory array 202 includes, as shown in FIG. 19, a plurality of word lines WL0, WL1, WL2, and so on formed in parallel with one another on the semiconductor substrate, and a plurality of bit lines BL0, BL1, BL2, and so on formed parallel with one another on a plane parallel with a main surface of the semiconductor substrate and above the word lines WL0, WL1, WL2, and so on. Moreover, the plurality of bit lines BL0, BL1, BL2, and so on are arranged three-dimensionally crossing (for example, perpendicular to) the plurality of word lines WL0, WL1, WL2, and so on.

A plurality of memory cells M211, M212, M213, M221, M222, M223, M231, M232, M123, and so on (hereinafter, represented by "memory cells M211, M212, and so on") are provided in matrix at corresponding cross-points with the word lines WL0, WL1, WL2, and so on and the bit lines BL0, BL1, 8L2, and so on. Here, the memory cells M211, M212, and so on are each configured to include an element corresponding to the variable resistance element 10 according to the embodiment 1 and a current control element which includes an MIM (Metal-Insulator-Metal) diode or MSM (Metal-Semiconductor-Metal) diode connected to each other.

The address input circuit 208 receives the address signal from an external circuit (not shown), and based on the address signal, outputs a row address signal to the row selection circuit/driver 203 and outputs a column address signal to the column selection circuit/driver 204. Here, the address signal is a signal indicative of a specific memory cell selected from among a plurality of memory cells M211, M212, and so on. The row address signal is a signal indicative of a row address in the address indicated by the address signal, and the column address signal is, similarly, a signal indicative of a column address in the address indicated by the address signal.

In the information write step, the control circuit 209 outputs, to the write circuit 205, a write signal instructing application of a write voltage to a bit line, according to input data Din inputted to the data input/output circuit 207. On the other hand, in the information read step, the control circuit 209 outputs, to the column selection circuit/driver 204, a read signal instructing read operation.

The row selection circuit/driver 203 receives the row address signal outputted from the address input circuit 208, and according to the row address signal, selects any of the plurality of word lines WL0, WL1, WL2, and so on, and applies a predetermined voltage to the selected word line.

The column selection circuit/driver 204 receives the column address signal outputted from the address input circuit 208, and according to the column address signal, selects any of the plurality of bit lines BL0, BL1, BL2, and so on, and applies a write voltage or a read voltage to the selected bit line.

When received a write signal outputted from the control circuit 209, the write circuit 205 outputs a signal instructing the row selection circuit/driver 203 to apply a voltage to the selected word line, and outputs a signal instructing the column selection circuit/driver 204 to apply a write voltage to the selected bit line.

Here, when writing a value corresponding to the resistance value in the low resistance state (the low resistance write process), the write circuit 205 outputs a signal instructing application of the low resistance writing voltage pulse of the voltage value VL. On the other hand, when writing a value corresponding to the resistance value in the high resistance state (the high resistance write process), the write circuit 205 outputs a signal instructing the application of a first high resistance writing voltage pulse of the voltage value VH1 and a second high resistance writing voltage pulse of the voltage value VH2 in the stated order. It should be noted that the polarity of the voltage herein corresponds to the polarity of the voltage applied to the variable resistance element, and is as the definition described in the embodiment 1.

In the information read step, the sense amplifier 106 detects an amount of current flowing through the selected bit line, from which data is to be read out, and determines the data stored therein. In the present embodiment, the resistance state of each of the memory cells M211, M212, and so on includes two states which are the high resistance state and the low resistance state, and each data is associated with a corresponding state. Thus, the sense amplifier 106 determines the resistance state of the variable resistance layer included in the selected memory cell, and according to the result, determines which binary data item is stored therein. The resultant output data DO is outputted to the external circuit via the data input/output circuit 207.

By operating as described above, the nonvolatile memory device 200 achieves stable storage operation.

It should be noted that a nonvolatile memory device having a multi-layered structure can also be achieved by three-dimensionally stacking the memory arrays included in the nonvolatile memory device according to the present embodiment shown in FIG. 19, that is, stacking the memory arrays in a direction perpendicular to memory array plane. Providing thus configured multi-layered memory array allows for implementation of a large capacity nonvolatile memory device.

Embodiment 4

A method for driving a nonvolatile memory device according to an embodiment 4 includes verify operation in the information write operation performed in the high resistance state. Hereinafter, this operation of the nonvolatile memory device will be described.

The verify operation checks if the resistance state of the variable resistance element satisfies a predetermined condition. By performing the verify operation the reliability of the stored data improves.

Figure 20A:
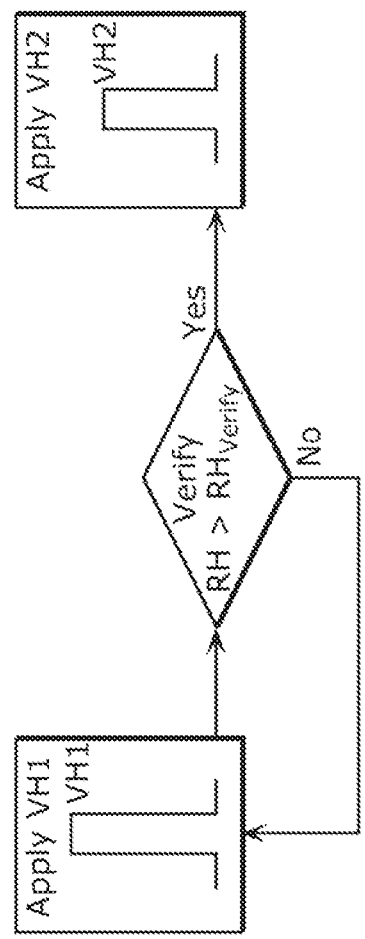
FIG. 20A is a diagram showing an exemplary operation of a nonvolatile memory device according to an embodiment 4 of the present invention.
Figure 20B:
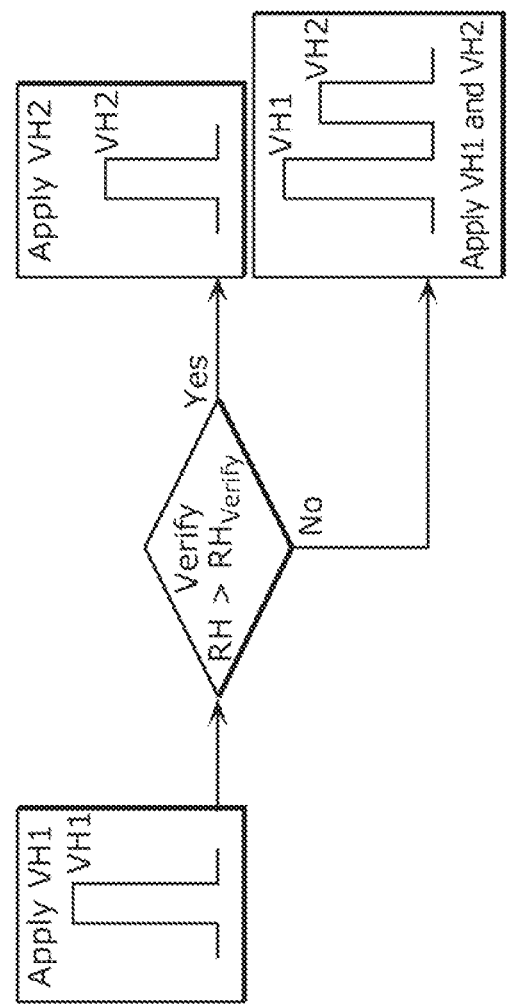
FIG. 20B is a diagram showing another exemplary operation of the nonvolatile memory device according to the embodiment 4 of the present invention.

FIG. 20A and FIG. 20B are diagrams showing exemplary operations of the nonvolatile memory device according to the present embodiment.

In the information write operation from the low resistance state to the high resistance state, as with the embodiment 1, the first high resistance writing pulse of the voltage value VH1 and the second high resistance writing pulse of the voltage value VH2 are applied to the variable resistance element 10 in the stated order.

First, as shown in FIG. 20A, to change the resistance state of the variable resistance element 10 from the low resistance state to the high resistance state, the first high resistance writing pulse of the voltage value VH1 is applied to the variable resistance element 10 in a desired memory cell. It is verified, after the application of the first high resistance writing pulse and before the application of the second high resistance writing pulse, whether the first high resistance writing pulse has changed the resistance state of the variable resistance element 10 to the high resistance state.

In the verify step, for example, data is read out from a memory cell having the data written thereto, and the read out data and an initially inputted expected value are compared. If the read out data and the expected value match, it is determined that the resistance state is successfully changed to the high resistance state. If the read out data does not match the expected value, it is determined that the resistance state has failed to change to the high resistance state.

When the resistance state is successfully changed to the high resistance state, as indicated by Yes in FIG. 20A, the second high resistance writing pulse is applied to the verified memory cell. This sets the variable resistance element 10 to the stable high resistance state, When the resistance state has failed to change to the high resistance state, as indicated by No in FIG. 20A, the first high resistance writing pulse is applied again to the verified memory cell. Then, the memory cell is verified again and if the resistance state is successfully changed to the high resistance state (Yes in FIG. 20A), the second high resistance writing pulse is applied to the verified memory cell. If the resistance state has failed to change to the high resistance state, the first high resistance writing pulse is applied again to the verified memory cell (No in FIG. 20A). For the case where the resistance state has failed to change to the high resistance state, the upper limit may be set to the number of time the first high resistance writing pulse is applied to the verified memory cell to inhibit repeating of the step of applying the first high resistance writing pulse.

FIG. 20B is a diagram showing another exemplary operation of the nonvolatile memory device according to the present embodiment.

Similarly to the process shown in FIG. 20A, first, as shown in FIG. 20B, to change the resistance state of the variable resistance element 10 from the low resistance state to the high resistance state, the first high resistance writing pulse of the voltage value VH1 is applied to the variable resistance element 10 in a desired memory cell. It is verified, after the application of the first high resistance writing pulse and before the application of the second high resistance writing pulse, whether the first high resistance writing pulse has changed the resistance state of the variable resistance element 10 to the high resistance state.

Similarly to the case shown in FIG. 20A, in the verify step, for example, data is read out from a memory cell having the data written thereto, and the read out data and an initially inputted expected value are compared. if the read out data and the expected value match, it is determined that the resistance state is successfully changed to the high resistance state. If the read out data does not match the expected value, it is determined that the resistance state has failed to change to the high resistance state.

When the resistance state is successfully changed to the high resistance state, as indicated by Yes in FIG. 20B, the second high resistance writing pulse is applied to the verified memory cell. This sets the variable resistance element 10 to the stable the high resistance state.

When the resistance state has failed to change to the high resistance state, as indicated by No in FIG. 20B, the first high resistance writing pulse is applied again to the verified memory cell, and, subsequently, the second high resistance writing pulse is applied thereto (No in FIG. 20B). This sets the variable resistance element 10 to the stable high resistance state. In other words, the exemplary operation shown in FIG. 20B is a method in which the verify step is performed once in the exemplary operation shown in FIG. 20A.

By including such verify operation between the application of the first high resistance writing pulse and the application of the second high resistance writing pulse, the resistance state of the variable resistance element 10 is changed to the high resistance state in the stable manner. This can improve the reliability of the data stored in the nonvolatile memory device.

Other Embodiment

In each embodiment described above, while the variable resistance layer has the stacked structure comprising the tantalum oxide, the present invention is not limited thereto. For example, the stacked structure may be a stacked structure comprising zirconium (Zr) oxide or a stacked structure comprising hafnium (Hf) oxide.

When employing a stacked structure comprising zirconium oxides, and the compositions of a first zirconium oxide and a second zirconium oxide are represented by $ZrO_x$ and $ZrO_y$, respectively, it is preferable that the first zirconium oxide and the second zirconium oxide both have oxygen-deficient compositions, opposed to stoichiometric composition, where x is equal to or greater than about 0.9 and equal to or less than about 1.4 and y is equal to or greater than about 1.8 and equal to or less than about 2. Preferably, the second zirconium oxide has a film thickness of 1 to 5 nm.

When employing a stacked structure comprising hafnium oxides, and the compositions of a first hafnium oxide and a second hafnium oxide are represented by $HfO_x$ and $HfO_y$, respectively, it is preferable that the first hafnium oxide and the second hafnium oxide both have oxygen-deficient compositions, opposed to stoichiometric composition, where x is equal to or greater than about 0.9 and equal to or less than about 1.6 and y is equal to or greater than about 1.89 and equal to or less than about 1.97. Preferably, the second hafnium oxide has a film thickness of 3 to 4 nm.

The oxygen-deficient hafnium oxide and the oxygen-deficient zirconium oxide described above can be made by a similar method to the method for manufacturing the oxygen-deficient tantalum oxide described in the above embodiments.

In the above, the example is described where the variable resistance layer comprises the transition metal oxide. However, the variable resistance layer may comprise a metal oxide. Thus, for example, aluminum oxide ($Al_2O_3$) or the like may be used alternatively to the transition metal oxide. In other words, "first transition metal," "second transition metal," "first transition metal oxide," and "second transition metal oxide" in the above description are by way of example of "first metal," "second metal," "first metal oxide," and "second metal oxide," respectively.

Furthermore, in the above, some transition metals included in the variable resistance layer have been illustrated. However, alternatively, titanium (Ti), niobium (Nb), tungsten (W), or the like may be used. Transition metals can adopt multiple oxidization states, and thus different resistance states can be achieved by the redox reaction.

Moreover, the above-described embodiments have been described as examples with reference to the case where the variable resistance layer 3 having the stacked structure comprises the same transition metal for a first transition metal included in the first transition metal oxide layer 3a and a second transition metal included in the second transition metal oxide layer 3b. However, the present invention is not limited thereto. In FIG. 1, the first transition metal included in the first transition metal oxide layer 3a and the second transition metal included in the second transition metal oxide layer 3b may be different materials. In this case, preferably, the oxygen deficiency in the second transition metal oxide layer 3b is lower than the oxygen deficiency in the first transition metal oxide layer 3a, that is, the second transition metal oxide layer 3b has a higher resistance value than the first transition metal oxide layer 3a. Such a configuration distributes, to the second transition metal oxide layer 3b, more of the voltage applied between the second electrode 4 and the first electrode 2 for the resistance change, thereby causing the redox reaction which occurs in the second transition metal oxide layer 3b to more likely to occur. Moreover, when the first transition metal and the second transition metal are different materials, preferably, the standard electrode potential of the second transition metal is lower than the standard electrode potential of the first transition metal. For example, by using an oxygen-deficient tantalum oxide for the first transition metal oxide layer 3a and $TiO_2$ for the second transition metal oxide layer 3b, stable resistance change operation is obtained. Titanium (standard electrode potential=−1.63 eV) is a material that has a lower standard electrode potential than tantalum (standard electrode potential=−0.6 eV). The standard electrode potential represents a characteristic in which the higher (greater) the value of standard electrode potential is the less the metal oxide is likely to oxidize. By disposing, in the second transition metal oxide layer 3b, a metal oxide that has a smaller standard electrode potential than the first transition metal oxide layer 3a, the redox reaction is more likely to occur in the second transition metal oxide layer 3b.

The resistance change phenomenon in the variable resistance layer having the stacked structure comprising any of the above described materials is believed to occur due to a fact that the redox reaction occurs in a micro filament formed in the second transition metal oxide layer 3b which has a high resistance value and the resistance value is changed.

Preferably, the second electrode 4 comprises a material having a higher standard electrode potential than the transition metal and the first electrode 2 included in the second transition metal oxide layer 3b, such as platinum (Pt), iridium (Ir) and palladium (Pd). According to such a configuration, the redox reaction selectively occurs in the second transition metal oxide layer 3b near an interface between the second electrode 4 and the second transition metal oxide layer 3b, and stable resistance change phenomenon is obtained.

Moreover, the variable resistance layer may not be configured to have the stacked structure comprising the transition metal oxide, and may be configured to have a single layer comprising the transition metal oxide. Even if the variable resistance layer is configured with such a single layer comprising the transition metal oxide, the stable operation can be achieved likewise.

It should be noted that a new embodiment can also be achieved by appropriately combining the embodiments described above.

The method for driving the variable resistance element and the nonvolatile memory device according to the present invention are useful as a method for driving variable resistance elements and nonvolatile memory devices for use in various electronic devices such as personal computers and mobile phones.

REFERENCE SIGNS LIST

1 Substrate
2 First electrode
3 Variable resistance layer
3a First tantalum oxide layer
3b Second tantalum oxide layer
4 Second electrode
5 Power supply
10 Variable resistance element
11 First terminal
12 Second terminal
100 Nonvolatile memory device
101 Memory main portion
102 Memory array
103 Row selection circuit/driver
104 Column selection circuit
105 Write circuit
106 Sense amplifier
107 Data input/output circuit
108 VCP power supply
109 Address input circuit
110 Control circuit
200 Nonvolatile memory device
201 Memory main portion
202 Memory array
203 Row selection circuit/driver
204 Column selection circuit/driver
205 Write circuit
206 Sense amplifier
207 Data input/output circuit
208 Address input circuit
209 Control circuit

The invention claimed is:

1. A driving method for driving a variable resistance element including a first electrode, a second electrode, and a variable resistance layer interposed between the first electrode and the second electrode,
the variable resistance layer having a stacked structure including:
a first metal oxide layer comprising an oxide of a first metal; and
a second metal oxide layer comprising an oxide of a second metal and having a lower oxygen deficiency than the first metal oxide layer,
a resistance value of the variable resistance layer reversibly changing by oxygen ions migrating based on a voltage pulse applied between the first electrode and the second electrode,
the driving method comprising:
a low resistance write process in which a resistance state of the variable resistance layer is changed from a high resistance state to a low resistance state by applying a low resistance writing voltage pulse having a first polarity to the variable resistance layer; and
a high resistance write process in which the resistance state of the variable resistance layer is changed from the low resistance state to the high resistance state by applying a high resistance writing voltage pulse having a second polarity different from the first polarity to the variable resistance layer,
wherein the high resistance write process completes one change of the resistance state of the variable resistance layer to the high resistance state by applying at least a plurality of the high resistance writing voltage pulses to the variable resistance layer,
the high resistance write process includes the steps of:
(a) applying a first high resistance writing voltage pulse having a voltage value VH1 between the first electrode and the second electrode; and
(b) applying a second high resistance writing voltage pulse having a voltage value VH2 smaller than the voltage value VH1 to the variable resistance layer, the second high resistance writing voltage pulse being applied to the variable resistance layer consecutively to the first high resistance writing voltage pulse.

2. The driving method according to claim 1,
wherein the second electrode is in contact with the second metal oxide layer, and
the second polarity is a polarity where a voltage of the second electrode is positive relative to a potential of the first electrode.

3. The driving method according to claim 1,
wherein the first metal is a first transition metal, and the second metal is a second transition metal.

4. A nonvolatile memory device comprising a variable resistance element and a voltage pulse application device,
the variable resistance element being nonvolatile and including:
a first electrode;
a second electrode; and
a variable resistance layer interposed between the first electrode and the second electrode, the variable resistance layer having a stacked structure including:
a first metal oxide layer comprising an oxide of a first metal; and
a second metal oxide layer comprising an oxide of a second metal and having a lower oxygen deficiency than the first metal oxide layer,
a resistance value of the variable resistance layer reversibly changing by oxygen ions migrating based on a voltage pulse applied between the first electrode and the second electrode,
the voltage pulse application device being configured to perform:
a low resistance write process in which a resistance state of the variable resistance layer is changed from a high resistance state to a low resistance state by applying a low resistance writing voltage pulse having a first polarity to the variable resistance layer; and
a high resistance write process in which the resistance state of the variable resistance layer is changed from the low resistance state to the high resistance state by applying a high resistance writing voltage pulse having a second polarity different from the first polarity to the variable resistance layer,
wherein the high resistance write process completes one change of the resistance state of the variable resistance layer to the high resistance state by applying at least a plurality of the high resistance writing voltage pulses to the variable resistance layer, and in the high resistance write process, processing of applying at least a first high resistance writing voltage pulse having a voltage value VH1 between the first electrode and the second electrode and, consecutively, processing of applying a second high resistance writing voltage pulse having a voltage value VH2 smaller than the voltage value VH1 are performed.

5. The nonvolatile memory device according to claim 4, wherein a resistance value of the second metal oxide layer is greater than a resistance value of the first metal oxide layer.

6. The nonvolatile memory device according to claim 5, wherein the first metal and the second metal are the same metal.

7. The nonvolatile memory device according to claim 4, wherein the first metal is a first transition metal and the second metal is a second transition metal.

8. The nonvolatile memory device according to claim 4, wherein the variable resistance layer includes an oxygen-deficient first tantalum oxide layer having a composition represented by $TaO_x$ (wherein $0.8 \leq x \leq 1.9$) and a second tantalum oxide layer having a composition represented by $TaO_y$ (wherein $2.1 \leq y$).

9. The nonvolatile memory device according to claim 4, wherein the first metal and the second metal are different metals and a standard electrode potential of the second metal is lower than a standard electrode potential of the first metal.

10. The driving method for driving the variable resistance element according to claim 1, wherein in step (b), the resistance state of the variable resistance layer is changed so as to fill, with oxygen ions, an oxygen vacancy which is caused in the variable resistance layer by applying the first high resistance writing voltage pulse to the variable resistance layer.

* * * * *